United States Patent
Tomita

(10) Patent No.: US 11,281,831 B2
(45) Date of Patent: Mar. 22, 2022

(54) INFORMATION PROCESSING DEVICE, INFORMATION PROCESSING METHOD, AND RECORDING MEDIUM

(71) Applicant: FUJITSU LIMITED, Kawasaki (JP)

(72) Inventor: Yoshinori Tomita, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 405 days.

(21) Appl. No.: 16/559,674

(22) Filed: Sep. 4, 2019

(65) Prior Publication Data
US 2019/0392101 A1    Dec. 26, 2019

Related U.S. Application Data

(63) Continuation of application No. PCT/JP2018/002091, filed on Jan. 24, 2018.

(30) Foreign Application Priority Data

Mar. 14, 2017  (JP) .............................. JP2017-048999

(51) Int. Cl.
    *G06F 30/33*    (2020.01)
(52) U.S. Cl.
    CPC ................... *G06F 30/33* (2020.01)
(58) Field of Classification Search
    CPC ............. G06F 30/3308; G06F 30/3315; G06F 2111/00; G06F 2119/22; G06F 30/33; G06F 30/337; G06F 30/327; G06F 17/50
    See application file for complete search history.

(56) References Cited

U.S. PATENT DOCUMENTS

| | | | | |
|---|---|---|---|---|
| 6,421,809 B1* | 7/2002 | Wuytack | ................ | G06F 8/433 |
| | | | | 716/132 |
| 2002/0053069 A1* | 5/2002 | Ohnishi | ................ | G06F 30/30 |
| | | | | 716/103 |

(Continued)

FOREIGN PATENT DOCUMENTS

| JP | 2004-054641 | 2/2004 |
|---|---|---|
| JP | 2006-092561 | 4/2006 |

(Continued)

OTHER PUBLICATIONS

International Search Report, mailed in connection with PCT/JP2018/002091 and dated Mar. 13, 2018 (1 page).

*Primary Examiner* — Rehana Perveen
*Assistant Examiner* — Cuong V Luu
(74) *Attorney, Agent, or Firm* — Fujitsu Patent Center

(57) ABSTRACT

An information processing device includes: a memory; a processor coupled to the memory and configured to: perform, based on input descriptions of a first circuit module that performs a first task and a second circuit module that receive data output from the first circuit module and performs a second task, high-level synthesis of the first circuit module and the second circuit module; synthesize an interface circuit that includes a memory that performs data transfer between the circuit modules based on write information of the data and read information of the data; calculate a minimum operation start interval of the interface circuit based on the write information of the data and the read information of the data; and provide, when the calculated minimum operation start interval is larger than a minimum operation start intervals of the first circuit module and the second circuit module, a storage element in the interface circuit.

15 Claims, 30 Drawing Sheets

(56) References Cited

U.S. PATENT DOCUMENTS

2007/0234267 A1    10/2007  Kakui
2007/0250803 A1 *  10/2007  Hattori .................... G06F 30/30
                                                    716/104
2014/0173252 A1 *   6/2014  Tomono .............. G06F 12/0842
                                                    712/32
2019/0034562 A1 *   1/2019  Ogawa .................. G06F 9/3001

FOREIGN PATENT DOCUMENTS

| JP | 2007-272797 | 10/2007 |
| JP | 2013-235474 | 11/2013 |
| JP | 2016-151830 |  8/2016 |

\* cited by examiner

| TIME | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| in [0] | r | | | | | | | | r | | | | | | | | | | |
| in [1] | | r | | | | | | | | r | | | | | | | | | |
| in [2] | | | r | | | | | | | | r | | | | | | | | |
| in [3] | | | | r | | | | | | | | r | | | | | | | |
| in [4] | | | | | r | | | | | | | | r | | | | | | |
| in [5] | | | | | | r | | | | | | | | r | | | | | |
| in [6] | | | | | | | r | | | | | | | | r | | | | |
| in [7] | | | | | | | | r | | | | | | | | r | | | |
| reg0 | | w | w | w | w | w | w | w | w | w | w | w | w | w | w | w | | | |
| logic | | | a | a | a | a | a | a | a | a | a | a | a | a | a | a | a | | |
| reg1 | | | w | w | w | w | w | w | w | w | w | w | w | w | w | w | w | w | |
| temp12[0] | | | | w | | | | | | | | w | | | | | | | |
| temp12[1] | | | | | w | | | | | | | | w | | | | | | |
| temp12[2] | | | | | | w | | | | | | | | w | | | | | |
| temp12[3] | | | | | | | w | | | | | | | | w | | | | |
| temp12[4] | | | | | | | | w | | | | | | | | w | | | |
| temp12[5] | | | | | | | | | w | | | | | | | | w | | |
| temp12[6] | | | | | | | | | | w | | | | | | | | w | |
| temp12[7] | | | | | | | | | | | w | | | | | | | | w |

| TIME | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| temp12[0] | r | | | | | | | r | r | | | | | | | r | | | |
| temp12[1] | r | r | | | | | | | r | r | | | | | | | | | |
| temp12[2] | | r | r | | | | | | | r | r | | | | | | | | |
| temp12[3] | | | r | r | | | | | | | r | r | | | | | | | |
| temp12[4] | | | | r | r | | | | | | | r | r | | | | | | |
| temp12[5] | | | | | r | r | | | | | | | r | r | | | | | |
| temp12[6] | | | | | | r | r | | | | | | | r | r | | | | |
| temp12[7] | | | | | | | r | r | | | | | | | r | r | | | |
| reg0 | | w | w | w | w | w | w | w | w | w | w | w | w | w | w | w | | | |
| logic | | | a | a | a | a | a | a | a | a | a | a | a | a | a | a | a | | |
| reg1 | | | w | w | w | w | w | w | w | w | w | w | w | w | w | w | w | w | |
| temp23[0] | | | | w | | | | | | | w | | | | | | | | |
| temp23[1] | | | | | w | | | | | | | w | | | | | | | |
| temp23[2] | | | | | | w | | | | | | | w | | | | | | |
| temp23[3] | | | | | | | w | | | | | | | w | | | | | |
| temp23[4] | | | | | | | | w | | | | | | | w | | | | |
| temp23[5] | | | | | | | | | w | | | | | | | w | | | |
| temp23[6] | | | | | | | | | | w | | | | | | | w | | |
| temp23[7] | | | | | | | | | | | w | | | | | | | | w |

FIG. 7A

| TASK A | | | | | | | | |
|---|---|---|---|---|---|---|---|---|
| | TIME | | | | | | | |
| Mem | 0 | 1 | 2 | 3 | 4 | 5 | 6 | 7 |
| 0 | w | | | | | | | |
| 1 | | w | | | | | | |
| 2 | | | w | | | | | |
| 3 | | | | w | | | | |
| 4 | | | | | w | | | |
| 5 | | | | | | w | | |
| 6 | | | | | | | w | |
| 7 | | | | | | | | w |

FIG. 7B

| TASK B | | | | | | | | |
|---|---|---|---|---|---|---|---|---|
| | TIME | | | | | | | |
| Mem | 0 | 1 | 2 | 3 | 4 | 5 | 6 | 7 |
| 0 | r | | | | | | | r |
| 1 | r | r | | | | | | |
| 2 | | r | r | | | | | |
| 3 | | | r | r | | | | |
| 4 | | | | r | r | | | |
| 5 | | | | | r | r | | |
| 6 | | | | | | r | r | |
| 7 | | | | | | | r | r |

FIG. 8

| Mem \ TIME | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| 0 | w | | | | | | | | | r | w | | | | | | | | | r | w |
| 1 | | w | r | | | | | | | | | w | r | | | | | | | | |
| 2 | | | w | r | r | | | | | | | | w | r | r | | | | | | |
| 3 | | | | w | r | r | | | | | | | | w | r | r | | | | | |
| 4 | | | | | w | r | r | | | | | | | | w | r | r | | | | |
| 5 | | | | | | w | r | r | | | | | | | | w | r | r | | | |
| 6 | | | | | | | w | r | r | | | | | | | | w | r | r | | |
| 7 | | | | | | | | w | r | r | | | | | | | | w | r | r | |

FIG. 10A

| Mem | TIME | | | | | | | | | |
|---|---|---|---|---|---|---|---|---|---|---|
| | 0 | 1 | 2 | 3 | 4 | 5 | 6 | 7 | 8 | 9 |
| 0 | w | | r | | | | | | | r |
| 1 | | w | r | r | | | | | | |
| 2 | | | w | r | r | | | | | |
| 3 | | | | w | r | r | | | | |
| 4 | | | | | w | r | r | | | |
| 5 | | | | | | w | r | r | | |
| 6 | | | | | | | w | r | r | |
| 7 | | | | | | | | w | r | r |

FIG. 10B

| Mem | TIME | | | | | | | | | |
|---|---|---|---|---|---|---|---|---|---|---|
| | 0 | 1 | 2 | 3 | 4 | 5 | 6 | 7 | 8 | 9 |
| 0 | w | | r | | | | | | | |
| 1 | | w | r | r | | | | | | |
| 2 | | | w | r | r | | | | | |
| 3 | | | | w | r | r | | | | |
| 4 | | | | | w | r | r | | | |
| 5 | | | | | | w | r | r | | |
| 6 | | | | | | | w | r | r | |
| 7 | | | | | | | | w | r | r |
| x0 | | | w | | | | | | | r |

FIG. 10C

| TIME Mem | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| 0 | w | | r | w | w | r | w | | r | w | | r | | | | | | | |
| 1 | | w | r | r | w | r | r | w | r | r | w | r | r | | | | | | |
| 2 | | | w | r | r | w | r | r | w | r | r | w | r | r | | | | | |
| 3 | | | | w | r | r | w | r | r | w | r | r | w | r | r | | | | |
| 4 | | | | | w | r | r | w | r | r | w | r | r | w | r | r | | | |
| 5 | | | | | | w | r | r | w | r | r | w | r | r | w | r | r | | |
| 6 | | | | | | | w | r | r | w | r | r | w | r | r | w | r | r | |
| 7 | | | | | | | | w | r | r | w | r | r | w | r | r | w | r | r |
| x0 | | | w | | | w | | | w | r | | w | r | | r | r | | | r |

FIG. 11

| Mem | TIME | | | | | | | | | | | | | | | | | | |
|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 |
| 0 | (w) | | r | (w) | | r | (w) | | r | (w) | | r | | | | | | | |
| 1 | | w | r | | w | r | | w | r | | w | r | r | | | | | | |
| 2 | | | w | r | | r | w | r | | r | w | r | r | | | | | | |
| 3 | | | | (w) | r | r | (w) | r | r | (w) | r | r | (w) | r | r | | | | |
| 4 | | | | | | w | r | r | w | r | r | w | r | w | r | r | | | |
| 5 | | | | | | | w | r | r | w | r | r | w | r | w | r | r | | |
| 6 | | | | | | | (w) | r | r | (w) | r | r | (w) | r | r | (w) | r | r | |
| 7 | | | | | | | | w | r | r | w | r | r | w | r | r | w | r | r |
| x0 | | | w | | | | | | | r | | | | | | | | | |
| | | | | | w | | | | | | r | | | | | | | | |
| | | | | | | | | w | | | | | r | | | | | | |
| | | | | | | | | | | w | | | | | | | | | r |

FIG. 17

| Mem \ TIME | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|---|
| 0 | w |   |   |   |   |   |   |   |   |   |   |   |   |   |   |   |   |   |   |   |   |   |   |   |   |   |
| 1 |   | w |   | w |   |   |   |   | w | w | r | w |   |   |   |   | w | w | r |   |   |   |   |   |   |   |
| 2 |   | r | w | r | r | r | r | r |   |   | r | r | w | r |   |   |   |   | r | r | w | r | r |   |   |   |
| 3 |   |   |   |   | w | r | r | r |   |   | w | r | r | w | r | r |   | w |   | w | r | w | r | r |   |   |
| 4 |   |   |   |   |   | w |   |   |   |   |   |   |   |   |   |   |   |   |   |   |   |   |   |   |   |   |
| 5 |   |   |   |   |   |   | w | r | r | r |   |   |   |   | w | w |   |   |   |   |   |   |   |   |   |   |
| 6 |   |   |   |   |   |   |   |   |   |   |   |   |   |   |   |   | r | r |   |   |   |   | w | w | r | r |
| 7 |   |   | w |   |   |   |   |   |   |   |   |   |   |   |   |   |   | r |   |   |   |   |   |   |   |   |
| x0 |   |   |   |   |   |   |   |   |   | r |   |   |   |   |   |   |   |   | w |   |   |   |   |   |   | r |

FIG. 18

|  |  | TIME | | | | | | | | | | |
|---|---|---|---|---|---|---|---|---|---|---|---|---|
|  |  | 0 | 1 | 2 | 3 | 4 | 5 | 6 | 7 | 8 | 9 | 10 |
| in [0] | 0 | 1 | | | | | | | | | | |
| in [1] | 1 | | 1 | | | | | | | | | |
| in [2] | 2 | | | 1 | | | | | | | | |
| in [3] | 3 | | | | 1 | | | | | | | |
| in [4] | 4 | | | | | 1 | | | | | | |
| in [5] | 5 | | | | | | 1 | | | | | |
| in [6] | 6 | | | | | | | 1 | | | | |
| in [7] | 7 | | | | | | | | 1 | | | |
| reg0 | 8 | | 1 | 1 | 1 | 1 | 1 | 1 | 1 | 1 | | |
| logic | 9 | | | 1 | 1 | 1 | 1 | 1 | 1 | 1 | 1 | |
| reg1 | 10 | | | 1 | 1 | 1 | 1 | 1 | 1 | 1 | 1 | |
| temp12[0] | 11 | | | | 1 | | | | | | | |
| temp12[1] | 12 | | | | | 1 | | | | | | |
| temp12[2] | 13 | | | | | | 1 | | | | | |
| temp12[3] | 14 | | | | | | | 1 | | | | |
| temp12[4] | 15 | | | | | | | | 1 | | | |
| temp12[5] | 16 | | | | | | | | | 1 | | |
| temp12[6] | 17 | | | | | | | | | | 1 | |
| temp12[7] | 18 | | | | | | | | | | | 1 |

FIG. 19A

| TIME | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|---|
| 0 in[0] | 1 | | | | | | | | | | | | | | | | | | | | | |
| 1 in[1] | | 1 | | | | | | | | | | | | | | | | | | | | |
| 2 in[2] | | | 1 | | | | | | | | | | 1 | | | | | | | | | |
| 3 in[3] | | | | 1 | | | | | | | | | | 1 | | | | | | | | |
| 4 in[4] | | | | | 1 | | | | | | | | | | 1 | | | | | | | |
| 5 in[5] | | | | | | 1 | | | | | | | | | | 1 | | | | | | |
| 6 in[6] | | | | | | | 1 | | | | | | | | | | 1 | | | | | |
| 7 in[7] | | | | | | | | 1 | | | | | | | | | | 1 | | | | |
| 8 reg0 | | 1 | 1 | 1 | 1 | 1 | 1 | 1 | 1 | | | 1 | 1 | 1 | 1 | 1 | 1 | 1 | 1 | | | |
| 9 logic | | | 1 | 1 | 1 | 1 | 1 | 1 | 1 | 1 | | | 1 | 1 | 1 | 1 | 1 | 1 | 1 | 1 | 1 | |
| 10 reg1 | | | | 1 | 1 | 1 | 1 | 1 | 1 | 1 | 1 | | | 1 | 1 | 1 | 1 | 1 | 1 | 1 | 1 | 1 |
| 11 temp12[0] | | | | 1 | | | | | | | | | | | | | | | | | | |
| 12 temp12[1] | | | | | 1 | | | | | | | | | | | | | | | | | |
| 13 temp12[2] | | | | | | 1 | | | | | | | | | | | | | | | | |
| 14 temp12[3] | | | | | | | 1 | | | | | | | | | | | | | | | |
| 15 temp12[4] | | | | | | | | 1 | | | | | | | | | | | | | | |
| 16 temp12[5] | | | | | | | | | 1 | | | | | | | | | | | | | |
| 17 temp12[6] | | | | | | | | | | 1 | | | | | | | | | | | | |
| 18 temp12[7] | | | | | | | | | | | 1 | | | | | | | | | | | |

FIG. 19B

| TIME | | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|---|
| in[0] | 0 | 1 | | | | | | | | | | | | | | | | | | |
| in[1] | 1 | | 1 | | | | | | | | | | | | | | | | | |
| in[2] | 2 | | | 1 | | | | | | | | | | | | | | | | |
| in[3] | 3 | | | | 1 | | | | | | | | | | | | | | | |
| in[4] | 4 | | | | | 1 | | | | | | | | | | | | | | |
| in[5] | 5 | | | | | | 1 | | | | | | | | | | | | | |
| in[6] | 6 | | | | | | | 1 | | | | | | | | | | | | |
| in[7] | 7 | | | | | | | | 1 | | | | | | | | | | | |
| reg0 | 8 | | | | | | | | | 1 | | | | | | | | | | |
| logic | 9 | | | 1 | 1 | 1 | 1 | 1 | 1 | 1 | 1 | | | | | | | | | |
| reg1 | 10 | | | | 1 | 1 | 1 | 1 | 1 | 1 | 1 | 1 | | | | | | | | |
| temp12[0] | 11 | | 1 | 1 | 1 | 1 | 1 | 1 | 1 | 1 | 1 | 1 | 1 | | | | | | | |
| temp12[1] | 12 | | | | | | | | | | | | 1 | 1 | | | | | | |
| temp12[2] | 13 | | | | | | | | | | | | | 1 | 1 | | | | | |
| temp12[3] | 14 | | | | | 1 | | | | | | | | | 1 | 1 | | | | |
| temp12[4] | 15 | | | | | | 1 | | | | | | | | | | 1 | | | |
| temp12[5] | 16 | | | | | | | 1 | | | | | | | | | | 1 | | |
| temp12[6] | 17 | | | | | | | | 1 | | | | | | | | | | 1 | |
| temp12[7] | 18 | | | | | | | | | | 1 | 1 | | | | | | | | 1 |

FIG. 20A

| | TIME | | | |
|---|---|---|---|---|
| | 0 | 1 | ... | t | ... |
| temp [0] | 1 | 16 | | 4 | |
| temp [1] | 0 | 1 | | 16 | |
| ... | | | | | |
| temp [n-1] | 0 | 0 | 0 | 0 | |

FIG. 20B

| temp 12 | 0 | 1 | 2 | 3 | 4 | 5 | 6 | 7 | 8 | 9 |
|---|---|---|---|---|---|---|---|---|---|---|
| 0 | 1 | 16 | 4 | 16 | 16 | 16 | 16 | 16 | 16 | 4 |
| 1 | | 1 | 4 | 4 | | | | | | |
| 2 | | | 1 | 4 | 4 | | | | | |
| 3 | | | | 1 | 4 | 4 | | | | |
| 4 | | | | | 1 | 4 | 4 | | | |
| 5 | | | | | | 1 | 4 | 4 | | |
| 6 | | | | | | | 1 | 4 | 4 | |
| 7 | | | | | | | | 1 | 4 | 4 |

FIG. 21A

M(if12)+shiftright(M(if12),10)

| temp 12 | TIME 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| 0 | 1 | 16 | 4 | 16 | 16 | 16 | 16 | 16 | 16 | 4 | 1 | 16 | 4 | 16 | 16 | 16 | 16 | 16 | 16 | 4 |
| 1 |  | 1 | 4 | 4 | 4 |  |  |  |  |  |  | 1 | 4 | 4 | 4 |  |  |  |  |  |
| 2 |  |  | 1 | 4 | 4 | 4 |  |  |  |  |  |  | 1 | 4 | 4 | 4 |  |  |  |  |
| 3 |  |  |  | 1 | 4 | 4 | 4 |  |  |  |  |  |  | 1 | 4 | 4 | 4 |  |  |  |
| 4 |  |  |  |  | 1 | 4 | 4 | 4 |  |  |  |  |  |  | 1 | 4 | 4 | 4 |  |  |
| 5 |  |  |  |  |  | 1 | 4 | 4 | 4 |  |  |  |  |  |  | 1 | 4 | 4 | 4 |  |
| 6 |  |  |  |  |  |  | 1 | 4 | 4 | 4 |  |  |  |  |  |  | 1 | 4 | 4 | 4 |
| 7 |  |  |  |  |  |  |  | 1 | 4 | 4 |  |  |  |  |  |  |  | 1 | 4 | 4 |

FIG. 21B

M(if12)+shiftright(M(if12),9)

| temp 12 | TIME 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| 0 | 1 | 16 | 4 | 16 | 16 | 16 | 16 | 16 | 16 | 5 | 16 | 4 | 16 | 16 | 16 | 16 | 16 | 16 | 4 | |
| 1 | | 1 | 4 | 4 | 4 | | | | | | 1 | 4 | 4 | 4 | 4 | 4 | | | | |
| 2 | | | 1 | 4 | 4 | 4 | 4 | 4 | | | | 1 | 4 | 4 | 4 | 4 | 4 | 4 | | |
| 3 | | | | 1 | 1 | 1 | 4 | 4 | 4 | | | | 1 | 1 | 1 | 4 | 4 | 4 | | |
| 4 | | | | | | | 1 | 1 | 4 | 4 | | | | | | 1 | 1 | 4 | 4 | |
| 5 | | | | | | | | | | | | | | | | | | | | |
| 6 | | | | | | | | | | | | | | | | | | | | |
| 7 | | | | | | | | | | | | | | | | | | | | |

FIG. 22A

| TIME | 0 | ... | 0 | wt0 1 | 16 | ... | 16 | ? | rt0 4 | 16 | ... | 16 | rt1 4 | 0 | ... | 0 |
|---|---|---|---|---|---|---|---|---|---|---|---|---|---|---|---|---|
| M (if12) [x0] | 0 | ... | 0 | 1 | 16 | ... | 16 | ? | 4 | 0 | ... | 0 | 0 | 0 | ... | 0 |
| M2 (if12) [x0] | 0 | ... | 0 | 0 | 0 | ... | 0 | ? | 1 | 16 | ... | 16 | 4 | 0 | ... | 0 |
| M2 (FIFO (x0)) | 0 | ... | 0 | 0 | 0 | ... | 0 | ? | 1 | 16 | ... | 16 | 4 | 0 | ... | 0 |

FIG. 22B

| TIME | 0 | ... | 0 | wt0 1 | 16 | ... | 16 | ? | rt0 4 | 16 | ... | 16 | 0 | ... | 0 |
|---|---|---|---|---|---|---|---|---|---|---|---|---|---|---|---|
| M (if12) [x0] | 0 | ... | 0 | 1 | 16 | ... | 16 | ? | 0 | 0 | ... | 0 | 16 | ... | 16 |
| M2 (if12) [x0] | 0 | ... | 0 | 0 | 0 | ... | 0 | ? | 4 | 16 | ... | 16 | 0 | ... | 0 |

FIG. 23

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| x0 | | w | | | w | | | w | r | | w | r | | | r | | | r | | | | | | |
| M2 (FIFO (x0)) | 0 | 1 | 16 | 16 | 16 | 16 | 16 | 16 | 4 | | | | | | | | | | | | | | | |
| shiftright (M2 (FIFO (x0)),3) | | | | | 1 | 16 | 16 | 16 | 16 | 16 | 16 | 4 | | | | | | | | | | | | |
| shiftright (M2 (FIFO (x0)),6) | | | | | | | | 1 | 16 | 16 | 16 | 16 | 16 | 16 | 4 | | | | | | | | | |
| shiftright (M2 (FIFO (x0)),9) | | | | | | | | | | | 1 | 16 | 16 | 16 | 16 | 16 | 16 | 4 | | | | | | |
| shiftright (M2 (FIFO (x0)),12) | | | | | | | | | | | | | | 1 | 16 | 16 | 16 | 16 | 16 | 16 | 4 | | | |
| shiftright (M2 (FIFO (x0)),15) | | | | | | | | | | | | | | | | | 1 | 16 | 16 | 16 | 16 | 16 | 16 | 4 |
| sum | 0 | 1 | 16 | 16 | 17 | 32 | 32 | 33 | 36 | 32 | 33 | 36 | 32 | 33 | 36 | 32 | 33 | 36 | 32 | 32 | 20 | 16 | 16 | 4 |

US 11,281,831 B2

INFORMATION PROCESSING DEVICE, INFORMATION PROCESSING METHOD, AND RECORDING MEDIUM

CROSS-REFERENCE TO RELATED APPLICATION

This application is a continuation application of International Application PCT/JP2018/002091 filed on Jan. 24, 2018 and designated the U.S., the entire contents of which are incorporated herein by reference. The International Application PCT/JP2018/002091 is based upon and claims the benefit of priority of the prior Japanese Patent Application No. 2017-048999, filed on Mar. 14, 2017, the entire contents of which are incorporated herein by reference.

FIELD

The embodiment discussed herein is related to an information processing device, an information processing method, and a recording medium.

BACKGROUND

In circuit design, the number of design steps of the design of circuit modules has been reduced by improvement of Register Transfer Level (RTL) design tools and high-level synthesis tools.

Japanese Laid-open Patent Publication No. 2004-54641 is disclosed as related art.

SUMMARY

According to an aspect of the embodiments, an information processing device includes: a memory; a processor coupled to the memory and configured to: perform, based on input descriptions of a first circuit module that performs processing of a first task and a second circuit module that receive data output from the first circuit module and performs processing of a second task, high-level synthesis of the first circuit module and the second circuit module; synthesize an interface circuit that includes a memory to and from which the data is input and output and that performs data transfer between the first circuit module and the second circuit module based on write information of the data that is written to the interface circuit by the first circuit module and read information of the data which is read from the interface circuit by the second circuit module; calculate a minimum operation start interval of the interface circuit based on the write information of the data and the read information of the data; and provide, when the calculated minimum operation start interval is larger than a minimum operation start interval of each of the first circuit module and the second circuit module, a storage element that is different from the memory and that stores data which is input to or output from the memory in the interface circuit based on the minimum operation start intervals of the first circuit module and the second circuit module.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7A is a diagram for describing write trace data, and FIG. 7B is a diagram for describing read trace data;

FIG. 8 is a diagram for describing the operation on an interface circuit;

FIGS. 10A to 10C are diagrams for describing a method of improving an operation start interval of the interface circuit;

FIG. 11 is a diagram for describing the operation on the interface circuit;

FIG. 17 is a diagram for describing an example for reducing the memory capacity in the interface circuit;

FIG. 18 is a diagram illustrating schedule information of the task A;

FIGS. 19A to 19C are diagrams illustrating schedule information when the task operation start interval of a task A is changed;

FIGS. 20A and 20B are diagrams illustrating a schedule of the interface circuit;

FIGS. 21A and 21B are diagrams for describing a method of determining a memory element in an interface circuit to be separated;

FIGS. 22A and 22B are diagrams illustrating a schedule of the interface circuit after improvement;

FIG. 23 is a diagram for describing a method of determining the size of a separately provided memory device;

DESCRIPTION OF EMBODIMENTS

For example, design support by design tools is not much provided for the design of an interface circuit for connecting circuit modules, which is responsible for data transfer between circuit modules. Since an interface circuit between circuit modules affects both the performance of the entire system and the circuit area, it is important to consider how to realize the interface circuit at the time of design.

As a method of creating an interface circuit between circuit modules, there is a method of designing the interface circuit manually as a dedicated circuit adapted to the operation of the circuit modules. According to this method, the interface circuit is created for dedicated use. Thus, an interface circuit that is excellent in terms of performance and circuit area can be created, but it takes a lot of time and labor for design. In addition, when the interface of circuit modules is changed, the interface circuit also needs to be changed, which is time-consuming.

As another method of creating an interface circuit, there is a method of creating an interface circuit by adopting a standard system as an interface between circuit modules and using an IP macro. According to this method, the number of design steps can be reduced, but the feasible range of customization for the purpose of performance improvement and circuit area reduction is limited. Further, as another method of creating an interface circuit, a technique for automatically synthesizing an interface circuit between circuit modules may be proposed.

Figure 26:
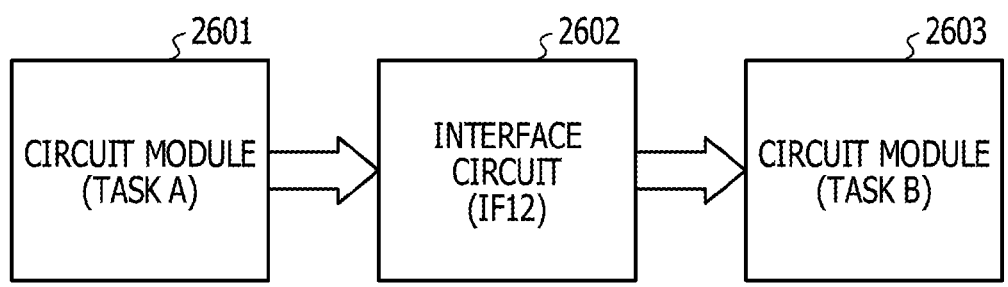
FIG. 26 is a diagram illustrating an exemplary configuration of a circuit to be designed.

As illustrated in FIG. 26, an interface circuit 2602 connects a circuit module 2601 that performs processing of a task A and a circuit module 2603 that performs processing of a task B using data output from the circuit module 2601. In this case, the performance of the entire system is determined by any one of the circuit module 2601, the interface circuit 2602, and the circuit module 2603 as a bottleneck. The interface circuit 2602 has a memory for transferring data between the circuit modules 2601 and 2603.

Here, the operation start interval (interval at which the same processing is repeated) of the interface circuit 2602 is determined depending on the write operation by the circuit module 2601, the read operation by the circuit module 2603, and the memory capacity of the interface circuit 2602. If the memory capacity of the interface circuit 2602 is reduced in order to avoid an increase in circuit area, the operation start interval of the interface circuit 2602 increases. When the operation start interval of the interface circuit 2602 is larger than the operation start intervals of the circuit module 2601 and the circuit module 2603, the interface circuit 2602 is a bottleneck. As a result, the period from the time when data is output from the circuit module 2601 to the time when the data is input to the circuit module 2603 becomes long to degrade the performance of the entire system.

An information processing device capable of automatically synthesizing an interface circuit that allows improvement of performance while suppressing an increase in circuit area may be provided.

Hereinafter, an embodiment of the present invention will be described based on the drawings.

In the following, as a hardware circuit to be designed, a circuit that performs the processing of a task A, and performs the processing of a task B using received output data of the task A as illustrated in FIG. 26 will be described as an example.

Figure 1:
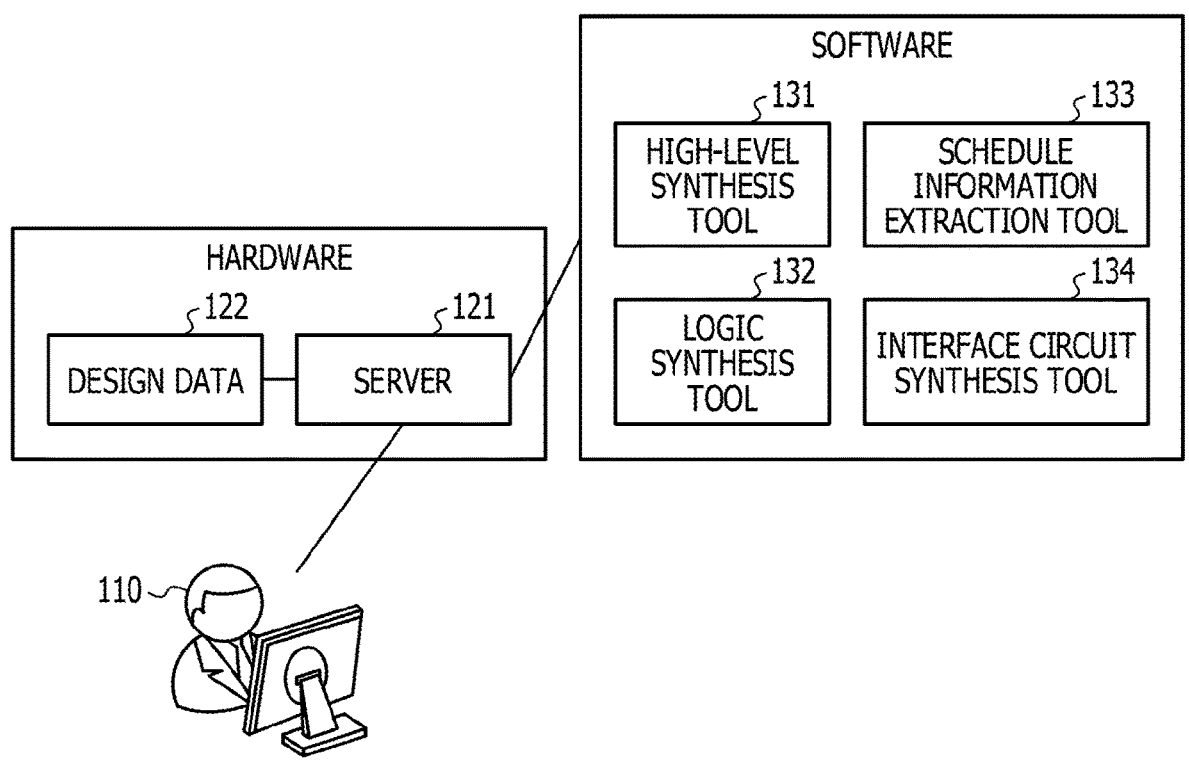
FIG. 1 is a diagram illustrating an exemplary configuration of an information processing device according to an embodiment of the present invention.

FIG. 1 is a diagram illustrating an exemplary configuration of an information processing device according to an embodiment of the present invention. A server 121 as an information processing device according to the present embodiment automatically synthesizes a hardware circuit to be designed based on design data 122 in response to an input operation or the like performed by a user (designer of hardware circuits or the like) 110 to provide circuit data. The design data 122 includes an input description (operation description) of circuits to be designed, a synthesis restriction, and the like.

The hardware circuit based on the design data 122 is automatically synthesized by executing software such as a high-level synthesis tool 131, a logic synthesis tool 132, a schedule information extraction tool 133, and an interface circuit synthesis tool 134 on the server 121. The high-level synthesis tool 131 is a tool that a synthesizes circuit module (RTL description) that perform processing according to input description (operation description) from the input description. The logic synthesis tool 132 is a tool that generates gate-level circuit data based on the RTL description.

The schedule information extraction tool 133 is a tool that obtains information of data input/output timing (write trace data and read trace data) from schedule information. The interface circuit synthesis tool 134 is a tool that synthesizes an interface circuit (RTL description) based on the write trace data and the read trace data obtained from the schedule information.

Here, the schedule information is obtained as one piece of log information output at the time of synthesis of the circuit module, and is information indicating the flow of processing of the circuit module. The write trace data is data write information indicating which memory element in the interface circuit the data is to be written to at which timing, and the read trace data is data read information indicating which memory element in the interface circuit the data is to be read from at which timing.

Figure 2:
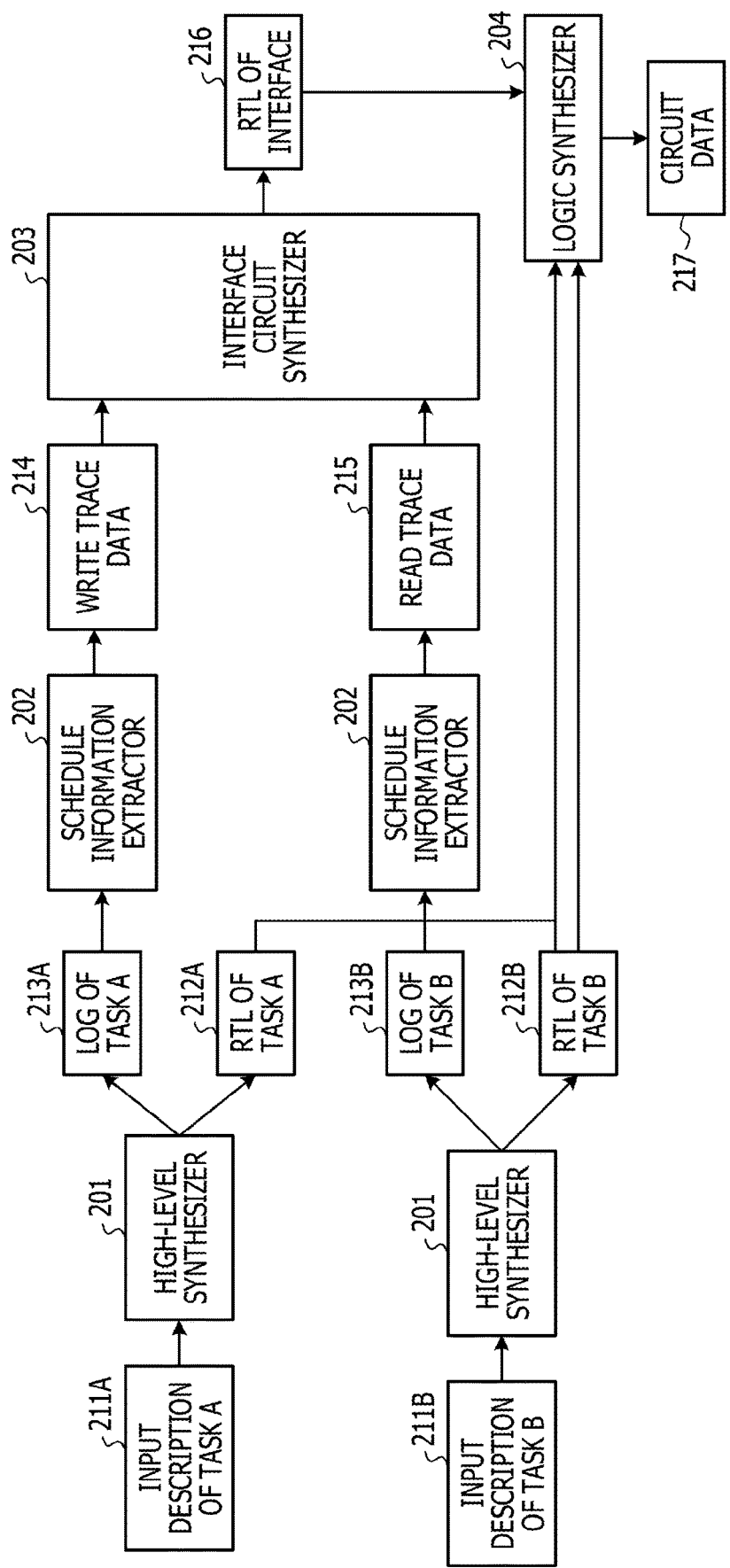
FIG. 2 is a diagram illustrating an exemplary functional configuration of the information processing device according to the embodiment.

FIG. 2 is a diagram illustrating an exemplary functional configuration of the information processing device according to the present embodiment. The information processing device according to the present embodiment includes a high-level synthesizer 201, a schedule information extractor 202, an interface circuit synthesizer 203, and a logic synthesizer 204. The functions of the high-level synthesizer 201, the schedule information extractor 202, the interface circuit synthesizer 203, and the logic synthesizer 204 are realized by the high-level synthesis tool 131, the schedule information extraction tool 133, the interface circuit synthesis tool 134, and the logic synthesis tool 132, respectively.

The high-level synthesizer 201 synthesizes circuit modules (RTL description) that perform processing described in an input description (operation description). The high-level synthesizer 201 has a pipeline synthesis function, and synthesizes circuit modules capable of operating in a pipeline. When an input description 211A of the task A is input, the high-level synthesizer 201 synthesizes a circuit module that performs the processing of the task A based on the input description 211A, and outputs an RTL description 212A of the circuit module and log information 213A. In addition, when an input description 211B of the task B is input, the high-level synthesizer 201 synthesizes a circuit module that performs the processing of the task B based on the input description 211B, and outputs an RTL description 212B of the circuit module (task B), and log information 213B. The log information 213A and 213B each includes schedule information indicating the flow of processing in the circuit module.

The schedule information extractor 202 obtains information of data input/output timing (write trace data and read trace data) from schedule information in log information output by the high-level synthesizer 201. The schedule information extractor 202 obtains write trace data 214 from the schedule information in the log information 213A of the circuit module (task A) that is the data output side (writes data), and outputs the write trace data 214. The schedule information extractor 202 also obtains read trace data 215 from the schedule information in the log information 213B of the circuit module (task B) that is the data input side (reads data), and outputs the read trace data 215.

The interface circuit synthesizer 203 synthesizes an interface circuit (RTL description), which is responsible for data transfer between circuit modules, based on the write trace data and the read trace data output by the schedule information extractor 202. The interface circuit synthesizer 203 analyzes the lifetime of the memory in the interface circuit 2602 using the write trace data 214 and the read trace data 215. The interface circuit synthesizer 203 also synthesizes the interface circuit based on the analysis result, and outputs an RTL description 216 of the interface circuit. The lifetime starts when data is written to a memory element and ends when the data is read last, and indicates a period for which the memory element holds the data.

The logic synthesizer 204 logically synthesizes circuit information (RTL description) of each of the circuits to generate gate-level circuit data. The logic synthesizer 204 generates gate-level circuit data 217 of a hardware circuit to be designed based on the RTL descriptions 212A and 212B of the circuit modules output by the high-level synthesizer 201 and the RTL description 216 of the interface circuit output by the interface circuit synthesizer 203, and outputs the gate-level circuit data 217.

Figure 3:
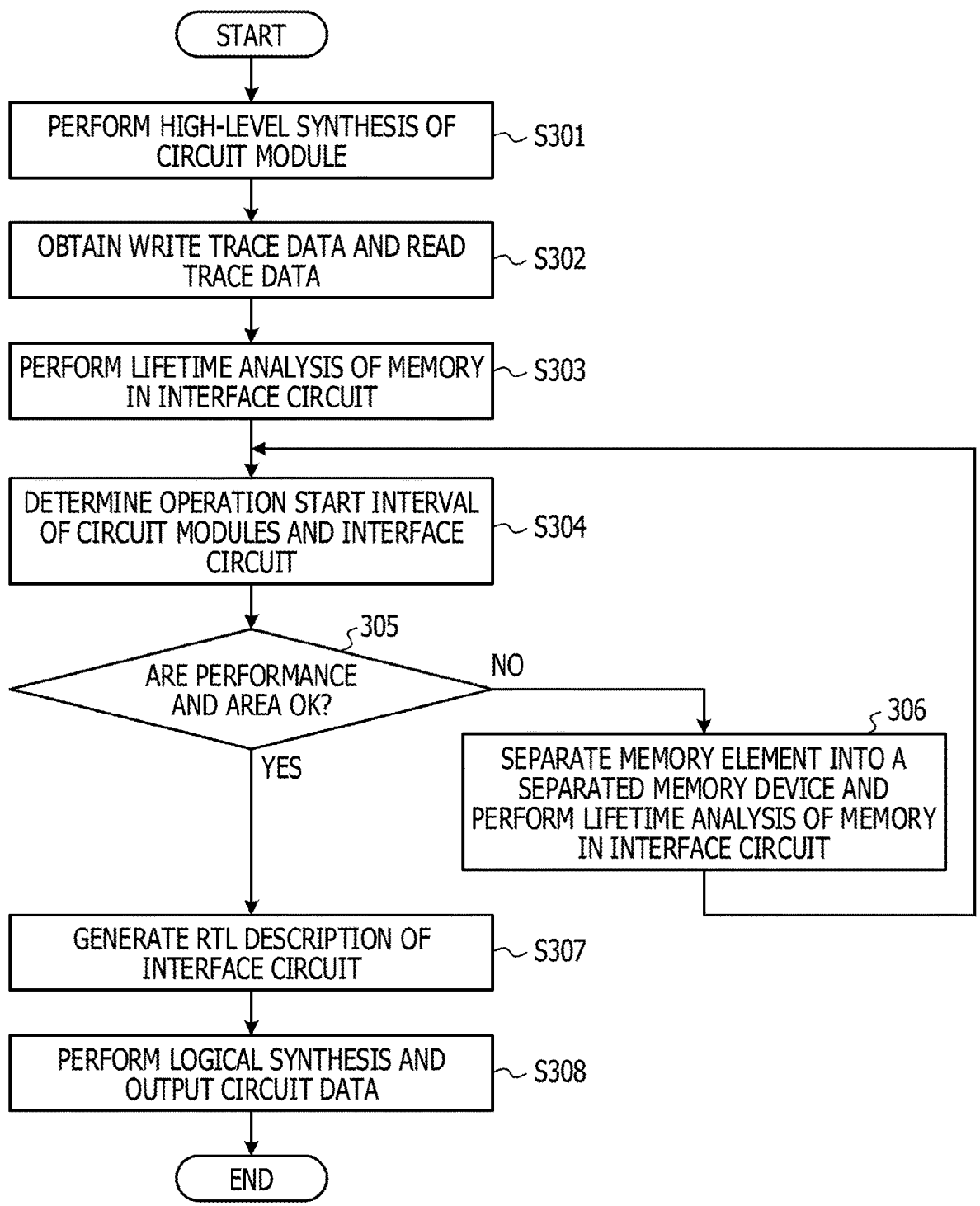
FIG. 3 is a flowchart illustrating a processing example of the information processing device according to the embodiment.

FIG. 3 is a flowchart illustrating a processing example of the information processing device according to the present embodiment.

When the processing starts, in step S301, the high-level synthesizer 201 of the information processing device performs high-level synthesis of the circuit module that performs the processing of the task A and the circuit module that performs the processing of the task B based on the input descriptions thereof. Next, in step S302, the schedule information extractor 202 of the information processing device obtains write trace data from the schedule information of the circuit module that performs the processing of the task A, and obtains read trace data from the schedule information of the circuit module that performs the processing of the task B. The circuit modules have been obtained by the high-level synthesis in step S301.

Subsequently, in step S303, the interface circuit synthesizer 203 of the information processing device performs lifetime analysis of a memory in the interface circuit using the write trace data and the read trace data obtained in step S302. Next, in step S304, the interface circuit synthesizer 203 determines an operation start interval of each of the circuit modules and an interface circuit based on the schedule information of corresponding circuit module and the analysis result of lifetime. Here, an operation start interval is an interval of repeated processing of the same task, and is a time interval from start of processing of a task to start of processing of the same task next time.

Next, in step S305, the interface circuit synthesizer 203 evaluates the processing performance and the circuit area of the entire circuit to be designed. If the processing performance and the circuit area do not satisfy predetermined conditions, the processing proceeds to step S306. For example, when the interface circuit synthesizer 203 determines that the minimum operation start interval of the interface circuit is larger than the minimum operation start interval of each circuit module so that the interface circuit is a bottleneck, the processing proceeds to step S306.

In step S306, the interface circuit synthesizer 203 selects one memory element of the memory in the interface circuit and separates the memory element into a separated memory device (storage element). The interface circuit synthesizer 203 then performs lifetime analysis of the memory in the interface circuit in a state where the memory element is separated into a separated memory device, and updates the analysis result. The processing then returns to step S304.

If the interface circuit synthesizer 203 determines that the processing performance and the circuit area of the entire circuit satisfy the predetermined conditions in step S305, the interface circuit synthesizer 203 generates an RTL description of the interface circuit by synthesizing the interface circuit in step S307. Subsequently, in step S308, the logic synthesizer 204 of the information processing device logically synthesizes the RTL descriptions of the circuit modules obtained in step S301 and the RTL description of the interface circuit obtained in step S307 and outputs circuit data. The processing then ends.

Figure 4:
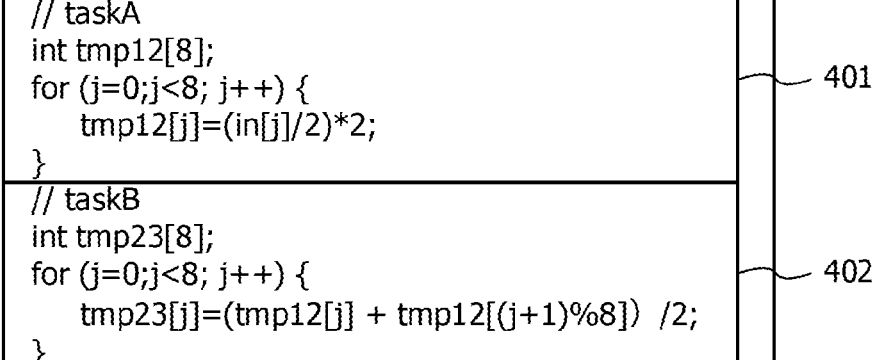
FIG. 4 is a diagram illustrating an example of an input description.

Hereinafter, circuit synthesis performed by the information processing device according to the present embodiment will be specifically described by taking, as an example, a case where circuits that perform the processing described in the input descriptions illustrated in FIG. 4 are synthesized. FIG. 4 is a diagram illustrating an example of input descriptions. In FIG. 4, a portion 401 is an input description of the task A, and a portion 402 is an input description of the task B. The input descriptions are not limited to those for two circuit modules but may include an input description for another circuit module (a task C in the example illustrated in FIG. 4).

In the present embodiment, it is assumed that a task does not perform both writing and reading to/from the memory in one interface circuit, and can perform only one of writing and reading to/from the memory in one interface circuit. In addition, it is assumed that a task can perform writing on each memory element in the memory in an interface circuit only once during one performance of the task, and can perform reading on each memory element in the memory in an interface circuit more than once during one performance of the task.

The input description 401 of the task A indicates that the task A uses data in[0] to in[7] as input and data tmp12[0] to tmp12[7] as output, and repeatedly performs arithmetic processing using data in[j] to output an arithmetic result as data tmp12[j] eight times with increment of the value j from 0 by 1. The input description 402 of the task B indicates that the task B uses data tmp12[0] to tmp12[7] as input, and data tmp23[0] to tmp23[7] as output, and repeatedly performs arithmetic processing using data tmp12[j] and tmp12[(j+1)%8] (% is a modulo operator) to output an arithmetic result as data tmp23[j] eight times with increment of the value j from 0 by 1.

When the input descriptions 401 and 402 are input to the high-level synthesizer 201 with specification that input data is stored in a memory (RAM) and output data is to be stored in the memory (RAM), the high-level synthesizer 201 synthesizes a circuit module that performs the processing of the task A and a circuit module that performs the processing of the task B. An example of the synthesis result of the high level synthesis by the high-level synthesizer 201 is illustrated in FIGS. 5A to 6B.

Figures 5A, 5B:
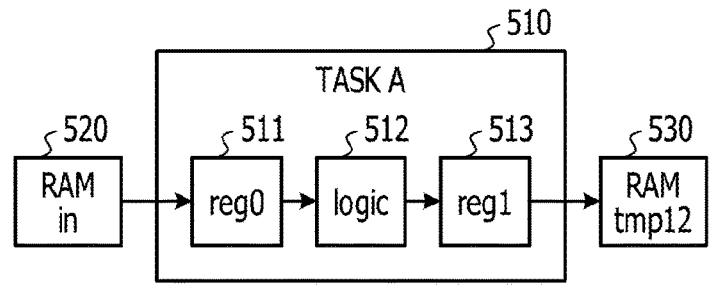
FIG. 5A is a block diagram illustrating an example of a circuit module related to a task A.
FIG. 5B is a diagram for describing schedule information of the task A.

FIG. 5A is a block diagram illustrating an example of a circuit module synthesized based on the input description 401 of the task A. In FIG. 5A, only a portion related to the data path is illustrated. As illustrated in FIG. 5A, a circuit module 510 that performs the processing of the task A includes registers 511 and 513 and a combinational logic circuit 512. A memory 520 is a memory (RAM) that stores input data in of the task A, and a memory 530 is a memory (RAM) that stores output data tmp12 of the task A.

The register (reg0) 511 is a register that stores data read from the memory 520 as input data. The combinational logic circuit (logic) 512 is a circuit that performs arithmetic processing using the data stored in the register (reg0) 511, and data obtained as the arithmetic result is stored in the register (reg1) 513. The register (reg1) 513 is a register that stores data to be written to the memory 530 as output data.

FIG. 5B is a diagram for describing schedule information of the task A obtained as one piece of log information of the synthesis result. In FIG. 5B, in[0] to in[7], reg0, logic, reg1, and, tmp12[0] to tmp12[7] indicate circuit resources related to the processing of the task A. in[0] to in[7] indicate memory elements of the memory 520 in which the input data in is stored, and tmp12[0] to tmp12[7] indicate memory elements of the memory 530 in which the output data tmp12 is to be stored. reg 0, logic, and reg 1 respectively indicate the register 511, the combinational logic circuit 512, and the register 513 included in the circuit module 510. In FIG. 5B, r, w, and a indicate the operation of the circuit resources, and r indicates reading, w indicates writing, and a indicates an active state.

As illustrated in FIG. 5B, in the processing of the task A, data is read from the memory element in[0] of the memory 520 in cycle 0, and the read data is written to the register 511 in cycle 1. Then, in cycle 2, the combinational logic circuit 512 performs arithmetic processing using the data written to the register 511 in cycle 1, and the data of the arithmetic result is written to the register 513. In next cycle 3, the data written to the register 513 in cycle 2 is written to the memory element tmp12[0] of the memory 530.

Since the circuit module 510 operates in a pipeline, data is read from the memory element in[1] of the memory 520 in cycle 1, data is read from the memory element in[2] of the memory 520 in cycle 2, and in the following cycles, data is similarly read from the memory elements in[3] to in[7] of the memory 520 sequentially, and the above-described processing is repeated. Then, in cycle 10, data is written from the register 513 to the memory element tmp12[7] of the memory 530, and thus one performance of the processing of the task A is completed.

As described above, although one performance of the processing of the task A takes eleven cycles, the circuit module 510 can perform pipeline operation at the task level, and therefore, as illustrated in FIG. 5B, in cycle 8 of the first performance of the processing of the task A, the second performance of the processing of the task A can be started. Thus, the circuit module 510 that performs the processing of the task A can repeat the processing of the same task A every eight cycles at the shortest, and the minimum operation start interval in the circuit module 510 is eight cycles.

Figures 6A, 6B:
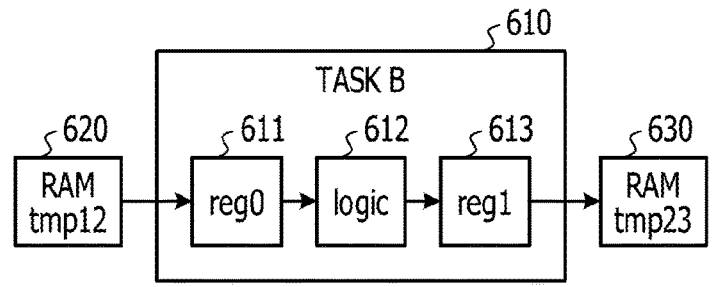
FIG. 6A is a block diagram illustrating an example of a circuit module related to a task B.
FIG. 6B is a diagram for describing schedule information of the task B.

FIG. 6A is a block diagram illustrating an example of a circuit module synthesized based on the input description 402 of the task B. Also in FIG. 6A, only a portion related to the data path is illustrated. As illustrated in FIG. 6A, a circuit module 610 that performs the processing of the task B includes registers 611 and 613 and a combinational logic circuit 612. A memory 620 is a memory (RAM) that stores input data tmp12 of the task B, and a memory 630 is a memory (RAM) that stores output data tmp23 of the task B.

The register (reg0) 611 is a register that stores data read from the memory 620 as input data. The combinational logic circuit (logic) 612 is a circuit that performs arithmetic processing using the data stored in the register (reg0) 611, and data obtained as the arithmetic result is stored in the register (reg1) 613. The register (reg1) 613 is a register that stores data to be written to the memory 630 as output data.

FIG. 6B is a diagram for describing schedule information of the task B obtained as the synthesis result. In FIG. 6B, tmp12[0] to tmp12[7], reg0, logic, reg1, and tmp23[0] to tmp23[7] indicate circuit resources related to the processing of the task B. tmp12[0] to tmp12[7] indicate memory elements of the memory 620 in which the input data tmp12 is stored, and tmp23[0] to tmp23[7] indicate memory elements of the memory 630 in which the output data tmp23 is to be stored. reg 0, logic, and reg 1 respectively indicate the register 611, the combinational logic circuit 612, and the register 613 included in the circuit module 610. In FIG. 6B, r, w, and a indicate the operation of the circuit resources, and r indicates reading, w indicates writing, and a indicates an active state.

As illustrated in FIG. 6B, in the processing of the task B, data is read from the memory elements tmp12[0] and tmp12[1] of the memory 620 in cycle 0, and the read data is written to the register 611 in cycle 1. Then, in cycle 2, the combinational logic circuit 612 performs arithmetic processing using the data written to the register 611 in cycle 1, and the data of the arithmetic result is written to the register 613. In next cycle 3, the data written to the register 613 in cycle 2 is written to the memory element tmp23[0] of the memory 630.

Since the circuit module 610 operates in a pipeline, data is read from the memory elements tmp12[1] and tmp12[2] of the memory 620 in cycle 1, and in the following cycles, data is similarly read from the memory elements of the memory 620 sequentially, and the above-described processing is repeated. Then, data is read from the memory elements tmp12[1] and tmp12[7] of the memory 620 in cycle 7, and arithmetic processing using the read data is performed, and in cycle 10, data is written from the register 613 to the memory element tmp23[7] of the memory 630, and thus one performance of the processing of the task B is completed.

As described above, although one performance of the processing of the task B takes eleven cycles, the circuit module 610 can perform pipeline operation at the task level, and therefore, as illustrated in FIG. 6B, in cycle 8 of the first performance of the processing of the task B, the second performance of the processing of the task B can be started. Thus, the circuit module 610 that performs the processing of the task B can repeat the processing of the same task B every eight cycles at the shortest, and the minimum operation start interval in the circuit module 610 is eight cycles.

When the schedule information of each of the task A and task B as described above is obtained, the schedule information extractor 202 obtains the write trace data and the read trace data related to the memory of the interface circuit based on the schedule information. The write trace data can be obtained by extracting the writing of data from the circuit module 510 to the memory 530 from the schedule information of the task A on the data output side, as illustrated in FIG. 7A. The read trace data can be obtained by extracting the reading of data from the memory 620 to the circuit module 610 from the schedule information of the task B on the data input side, as illustrated in FIG. 7B. The write trace data illustrated in FIG. 7A and the read trace data illustrated in FIG. 7B can be expressed by the following expressions. Here, w[i]=j indicates that data is written to the i-th memory element in cycle j, and r[i]={j, k} indicates that data is read from the i-th memory element in cycles j and k.

$$w[0] = 0 \quad r[0] = \{0, 7\} \qquad \text{[Expression 1]}$$
$$w[1] = 1 \quad r[1] = \{0, 1\}$$
$$w[2] = 2 \quad r[2] = \{1, 2\}$$
$$w[3] = 3 \quad r[3] = \{2, 3\}$$
$$w[4] = 4 \quad r[4] = \{3, 4\}$$
$$w[5] = 5 \quad r[5] = \{4, 5\}$$
$$w[6] = 6 \quad r[6] = \{5, 6\}$$
$$w[7] = 7 \quad r[7] = \{6, 7\}$$

Next, the interface circuit synthesizer 203 analyzes the lifetime of the memory using the obtained write trace data and the read trace data related to the memory of the interface circuit to obtain information regarding a time zone during which data is held in each memory element. The task A and the task B have a dependency that the processing of the task B is started after the processing of the task A is started. Therefore, assuming that the processing of that task A is started in cycle 0 and the processing of the task B is started in cycle t (t>0), the write trace data and the read trace data can be converted as follows.

$$w[0] = 0 \quad r[0] = \{t+0, t+7\} \qquad \text{[Expression 2]}$$
$$w[1] = 1 \quad r[1] = \{t+0, t+1\}$$
$$w[2] = 2 \quad r[2] = \{t+1, t+2\}$$
$$w[3] = 3 \quad r[3] = \{t+2, t+3\}$$
$$w[4] = 4 \quad r[4] = \{t+3, t+4\}$$
$$w[5] = 5 \quad r[5] = \{t+4, t+5\}$$
$$w[6] = 6 \quad r[6] = \{t+5, t+6\}$$
$$w[7] = 7 \quad r[7] = \{t+6, t+7\}$$

Since data in a memory in an interface circuit is read after it is written, and the processing of the task B is preferably started as soon as possible from the viewpoint of processing performance, the minimum value t that satisfies the following expression is obtained.

$$w[x] = y, \quad y \in r[x] \qquad \text{[Expression 3]}$$

For example, the expression is expanded as follows.

$$x = 0: \quad 0 < t+0 \quad \text{and} \quad 0 < t+7 \qquad \text{[Expression 4]}$$
$$x = 1: \quad 1 < t+0 \quad \text{and} \quad 1 < t+1$$
$$x = 2: \quad 2 < t+1 \quad \text{and} \quad 2 < t+2$$
$$x = 3: \quad 3 < t+2 \quad \text{and} \quad 3 < t+3$$
$$x = 4: \quad 4 < t+3 \quad \text{and} \quad 4 < t+4$$
$$x = 5: \quad 5 < t+4 \quad \text{and} \quad 5 < t+5$$
$$x = 6: \quad 6 < t+5 \quad \text{and} \quad 6 < t+6$$
$$x = 7: \quad 7 < t+6 \quad \text{and} \quad 7 < t+7$$

By solving this expression, t=2 is obtained. Therefore, as a result of the memory lifetime analysis, the writing and reading of data to/from the memory of the interface circuit are performed at timings as illustrated in FIG. 8. FIG. 8 is a diagram for describing the operation on the memory of the interface circuit. The 0-th memory element holds data for ten cycles from cycle 0 to cycle 9, and other memory elements hold data for three cycles. Therefore, the interface circuit requires ten cycles for one performance, and the minimum operation start interval in the interface circuit is ten cycles.

When the minimum operation start interval in the interface circuit is determined based on the lifetime analysis result, the interface circuit synthesizer 203 determines an operation start interval of each of the circuit module 510 that performs processing of the task A, the circuit module 610 that performs processing of the task B, and the interface circuit that connects the circuit module 510 and the circuit module 610. In this example, the minimum operation start interval of the circuit modules 510 and 610 is eight cycles while the minimum operation start interval of the interface circuit is ten cycles. Therefore, the operation start intervals of the circuit module 510, the circuit module 610, and the interface circuit are determined to ten cycles that is the largest among these minimum operation start intervals.

Figure 9:
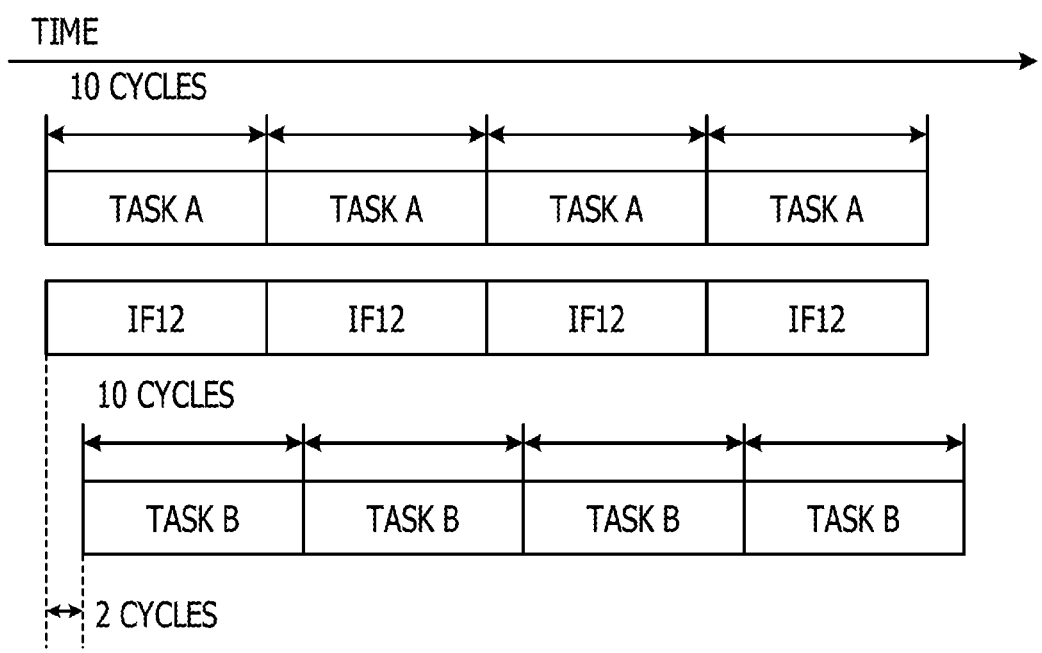
FIG. 9 is a diagram illustrating an example of processing timings of the task A, the interface circuit, and the task B.

In this case, the operation timings of the circuit module that performs the processing of the task A, the interface circuit, and the circuit module that performs the processing of the task B are as illustrated in FIG. 9. FIG. 9 is a diagram illustrating an example of processing timings of the task A, the interface circuit, and the task B. In FIG. 9, IF12 indicates the processing timings of the interface circuit. Since the task A processes new input data every ten cycles and the task B outputs new output data every ten cycles, a system that performs the task A and task B has the performance to process new data once every ten cycles.

While the minimum operation start interval of the circuit modules 510 and 610 is eight cycles, the minimum operation start interval of the interface circuit is ten cycles. In such a case where the minimum operation start interval of the interface circuit is larger than the minimum operation start interval of the circuit module, it is possible to prevent the interface circuit from being a bottleneck by providing a separated memory device (storage element) in the interface circuit based on the minimum operation start interval of the circuit modules.

Hereinafter, a method of improving the minimum operation start interval in the interface circuit by providing a separated memory device in the interface circuit will be described. The interface circuit synthesizer 203 selects a memory element to contact first in the processing of the next performance of the task at an access timing to the memory of the interface circuit. In this example, as illustrated in FIG. 8, the 0-th memory element of the memory in the interface circuit is the memory element to contact first. Thus, the 0-th memory element is selected.

Reading is then controlled such that after data is read from the 0-th memory element of the memory in the interface circuit in cycle 2, the data is written to a separated memory device x0, and in cycle 9, reading is not performed on the 0-th memory element but data is read from the separated memory device x0. With this control, the access timings in the interface circuit illustrated in FIG. 10A is changed to the access timings in the interface circuit illustrated in FIG. 10B, and the lifetime of the 0-th memory element is reduced from ten cycles to three cycles.

The minimum operation start interval of the interface circuit calculated based on the changed lifetime is three cycles. Here, the lifetime of the memory device x0 is not considered. Therefore, in the case of pipeline operation, access to the interface circuit at access timings as illustrated in FIG. 10C becomes possible. Here, as is apparent from FIG. 10C, data is read from the memory device x0 in the order of writing. Thus, by using a first in first out (FIFO) buffer as the memory device x0, it is possible to correctly pass data from the task A to the task B even if the lifetimes of data pieces in the memory device x0 overlap.

When the interface circuit is accessed as illustrated in FIG. 10C, three data pieces are stored by cycle 8, the data pieces are read in cycle 9, and thereafter, writing and reading of a data piece are alternately repeated. Thus, a 3-stage FIFO buffer is sufficient as the memory device x0, and an increase in circuit area can also be suppressed. The size of the FIFO buffer is determined based on the analysis result of lifetime analysis of the memory in the interface circuit based on the write trace data and the read trace data.

As described above, the minimum operation start interval in the interface circuit can be improved by providing a separated memory device x0 in the interface circuit. The interface circuit synthesizer 203 determines the operation start interval of each of the circuit module 510, the circuit module 610, and the interface circuit using the improved minimum operation start interval of the interface circuit again. Since the minimum operation start interval of the circuit modules 510 and 610 is eight cycles and the minimum operation start interval of the interface circuit is three cycles, the operation start interval of the circuit module 510, the circuit module 610, and the interface circuit is determined to be eight cycles, which is the largest among the minimum operation start intervals.

Figure 11:
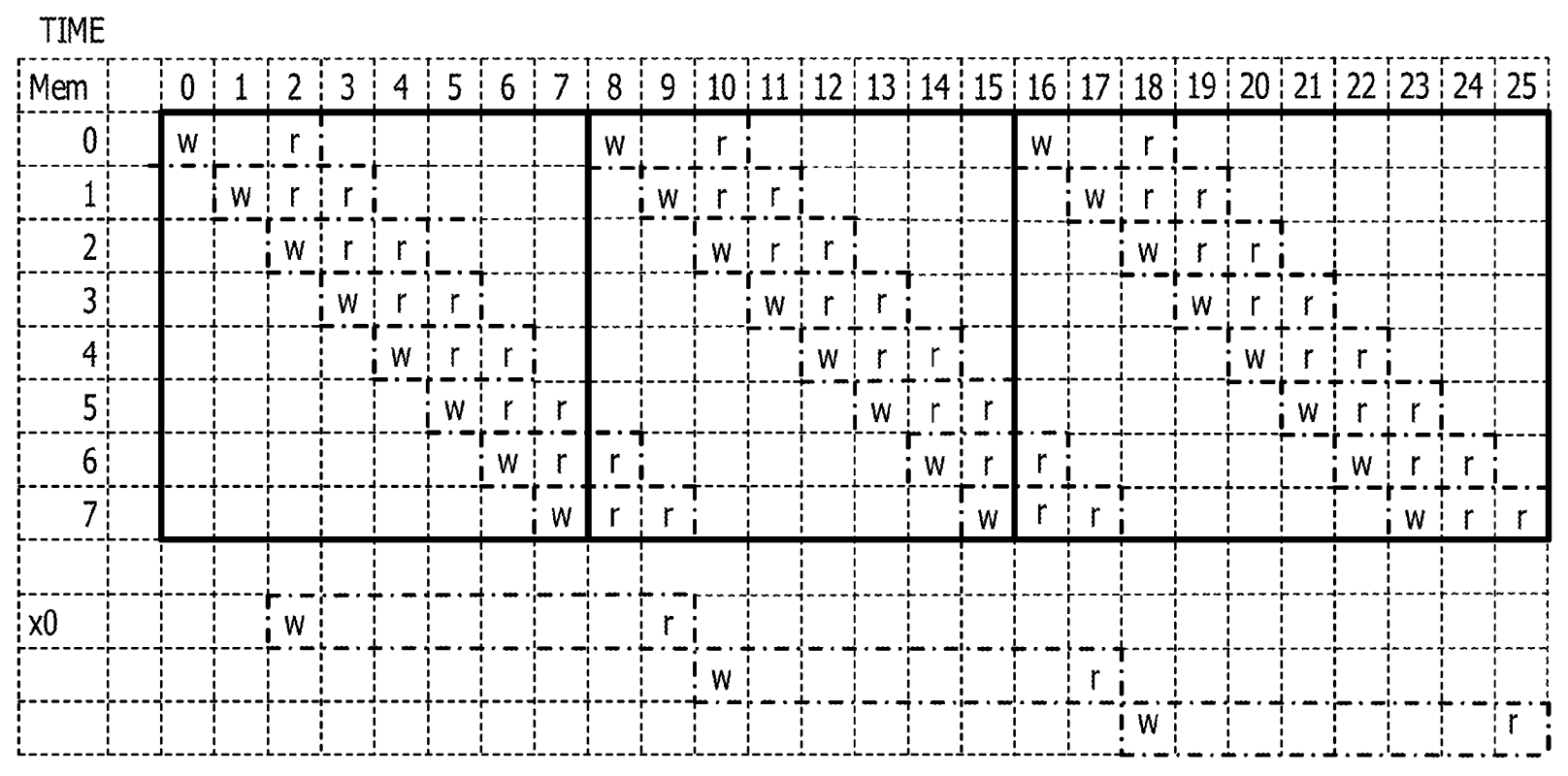

In this case, it is sufficient that the operation start interval of the interface circuit is set to eight cycles, and the access timings in the interface circuit are as illustrated in FIG. 11. As illustrated in FIG. 11, the same memory element of the memory in the interface circuit is not simultaneously accessed in the n-th performance or the (n+1)-th performance. Thus, the processing of the task A and the task B can be processed in a pipeline according to the dependency. As to the memory device x0, lifetimes do not overlap. Thus, the memory device x0 does not have to be a FIFO buffer, and may be, for example, a register.

Thus, the interface circuit synthesizer 203 generates an RTL description of the interface circuit having an improved operation start interval due to provision of the separated memory device x0. The logic synthesizer 204 then logically synthesizes the RTL description of the interface circuit and the RTL descriptions of the circuit modules 510 and 610 to generate circuit data of a circuit that performs the processing described by the input descriptions 401 and 402 illustrated in FIG. 4.

Figure 12:
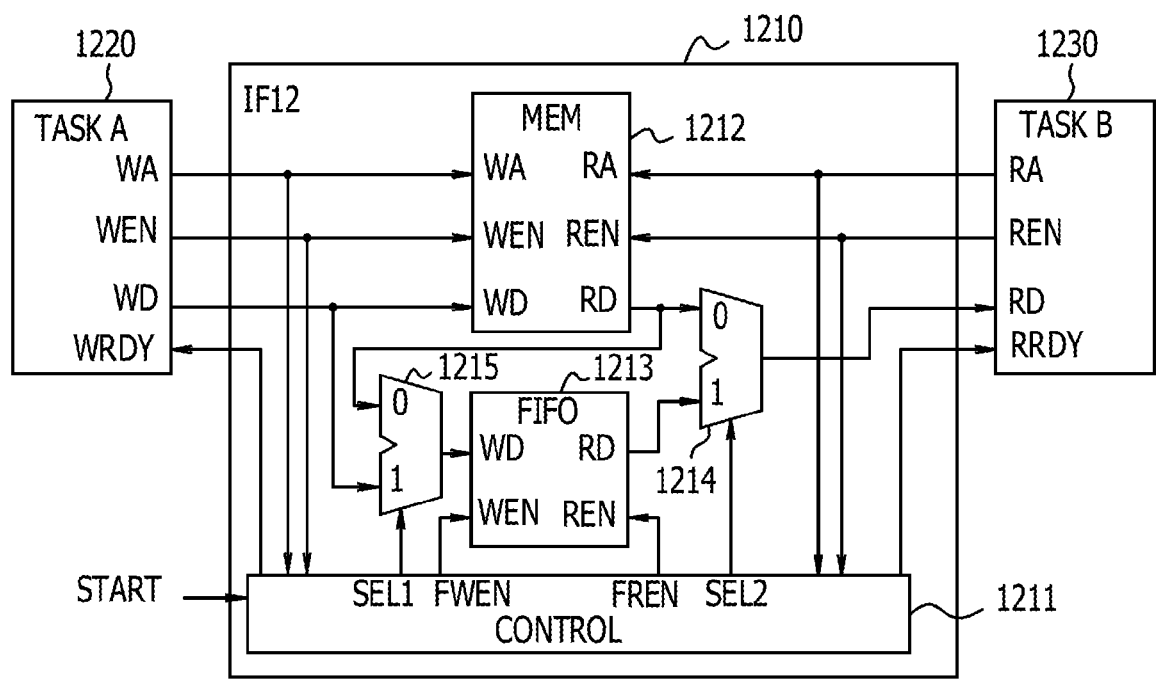
FIG. 12 is a diagram illustrating an exemplary configuration of the interface circuit.

FIG. 12 is a diagram illustrating an exemplary configuration of the interface circuit according to the present embodiment. FIG. 12 illustrates an example, in which a memory and a FIFO buffer are provided in the interface circuit. An interface circuit (IF12) 1210 is connected to each of a circuit module 1220 that performs the processing of the task A and a circuit module 1230 that performs the processing of the task B, and transfers data from the circuit module 1220 to the circuit module 1230.

The circuit module 1220 receives a write ready signal WRDY from the interface circuit 1210, and outputs a write enable signal WEN, a write address WA, and write data WD to the interface circuit 1210. The circuit module 1230 receives a read ready signal RRDY and read data RD from the interface circuit 1210, and outputs a read enable signal REN and a read address RA to the interface circuit 1210. The number of ports related to the read address RA and the read data RD and provided in the interface circuit 1210 and the circuit module 1230 is set in accordance with the number of data pieces to be read simultaneously in the processing of the task B.

The interface circuit 1210 includes a control circuit 1211, a memory 1212, a FIFO buffer 1213, and multiplexers 1214 and 1215. The control circuit 1211 notifies the circuit module 1220 that data can be written to the interface circuit 1210 by outputting the write ready signal WRDY, and notifies the circuit module 1230 that data can be read from the interface circuit 1210 by outputting a read ready signal RRDY. The control circuit 1211 also controls the FIFO buffer 1213 and the multiplexers 1214 and 1215 to control writing and reading of data to/from the FIFO buffer 1213. The write ready signal WRDY indicates that data can be written when the value is "1", and the read ready signal RRDY indicates that data can be read when the value is "1".

The memory 1212 and the FIFO buffer 1213 store data to be transferred from the circuit module 1220 to the circuit module 1230. When the write enable signal WEN that is input is "1", the memory 1212 stores the write data WD in a memory element specified by the write address WA. When a read enable signal REN that is input is "1", the memory 1212 reads data from a memory element specified by a read address RA and outputs the read data as a first piece of read data RD.

When a FIFO write enable signal FWEN received from the control circuit 1211 is "1", the FIFO buffer 1213 stores data output from the multiplexer 1215. When a FIFO read enable signal FREN received from the control circuit 1211 is "1", the FIFO buffer 1213 outputs the oldest piece of data among the stored pieces of data as a second piece of read data RD.

According to a control signal SEL2 output from the control circuit 1211, the multiplexer 1214 outputs either the first piece of read data RD output from the memory 1212 or the second piece of read data RD output from the FIFO buffer 1213 to the circuit module 1230 as read data RD. The multiplexer 1214 outputs the first piece of read data RD as the read data RD to the circuit module 1230 when the control signal SEL2 is "0", and outputs the second piece of read data RD as the read data RD to the circuit module 1230 when the control signal SEL2 is "1". Here, the control circuit 1211 sets the FIFO read enable signal FREN and the control signal SEL2 to "1" at a predetermined timing determined in advance based on the schedule information.

According to a control signal SEL1 output from the control circuit 1211, the multiplexer 1215 outputs either the first piece of read data RD output from the memory 1212 or the write data WD output from the circuit module 1220 to the FIFO buffer 1213. The multiplexer 1215 outputs the first piece of read data RD to the FIFO buffer 1213 when the control signal SEL1 is "0", and outputs the write data WD to the FIFO buffer 1213 when the control signal SEL1 is "1". By providing the multiplexer 1215, even data that is not read a plurality of times, and thus is read only once in the processing of the task B can be stored in the FIFO buffer 1213.

Figure 13:
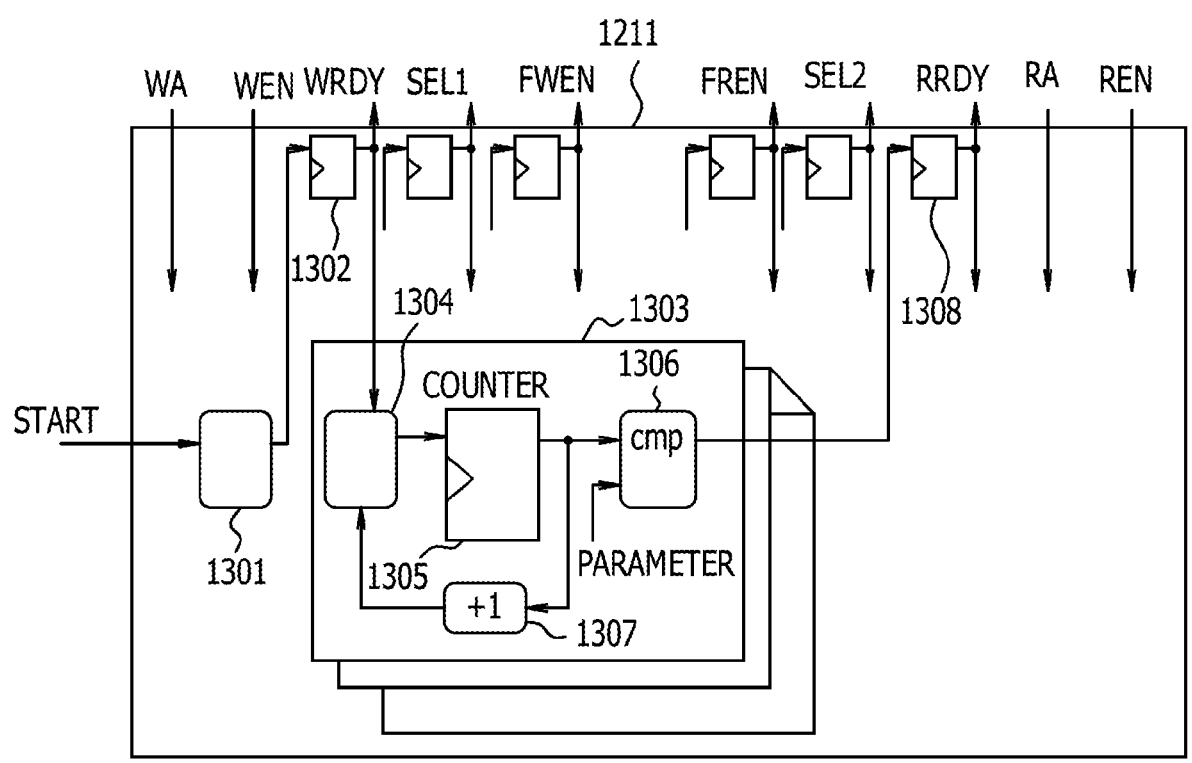
FIG. 13 is a diagram illustrating an exemplary configuration of a control circuit.

FIG. 13 is a diagram illustrating an exemplary configuration of the control circuit 1211 according to the present embodiment. FIG. 13 illustrates a configuration for generating a read ready signal RRDY in the control circuit 1211. When the start signal indicating start of processing is input to a combinational circuit 1301, the output of a flip flop 1302 for the write ready signal WRDY is changed to "1". The output of the flip flop 1302 is output as the write ready signal WRDY to the circuit module 1220 and also to a read ready signal generation circuit 1303.

The read ready signal generation circuit 1303 operates to set the read ready signal RRDY to "1" after a predetermined number of cycles have elapsed since the write ready signal WRDY is changed to "1". The read ready signal generation circuit 1303 counts the number of cycles elapsed after the write ready signal WRDY is changed to "1" by a counter including a combinational circuit 1304, a flip flop 1305, and an adder 1307. Further, the read ready signal generation circuit 1303 determines whether the predetermined number of cycles have elapsed by comparing the count value of the number of elapsed cycles with a predetermined parameter value using a comparator 1306.

Upon determination that the predetermined number of cycles has elapsed, the read ready signal generation circuit 1303 sets the output of a flip flop 1308 for the read ready signal RRDY to "1". The output of the flip flop 1308 is output to the circuit module 1230 as the read ready signal RRDY. The parameter value used for comparison by the comparator 1306 is a constant value determined based on schedule information or the like. Similarly, it is sufficient that other signals output from the control circuit 1211 are generated by using a counter or a state by providing a counter or the like in the control circuit 1211.

Figure 14:
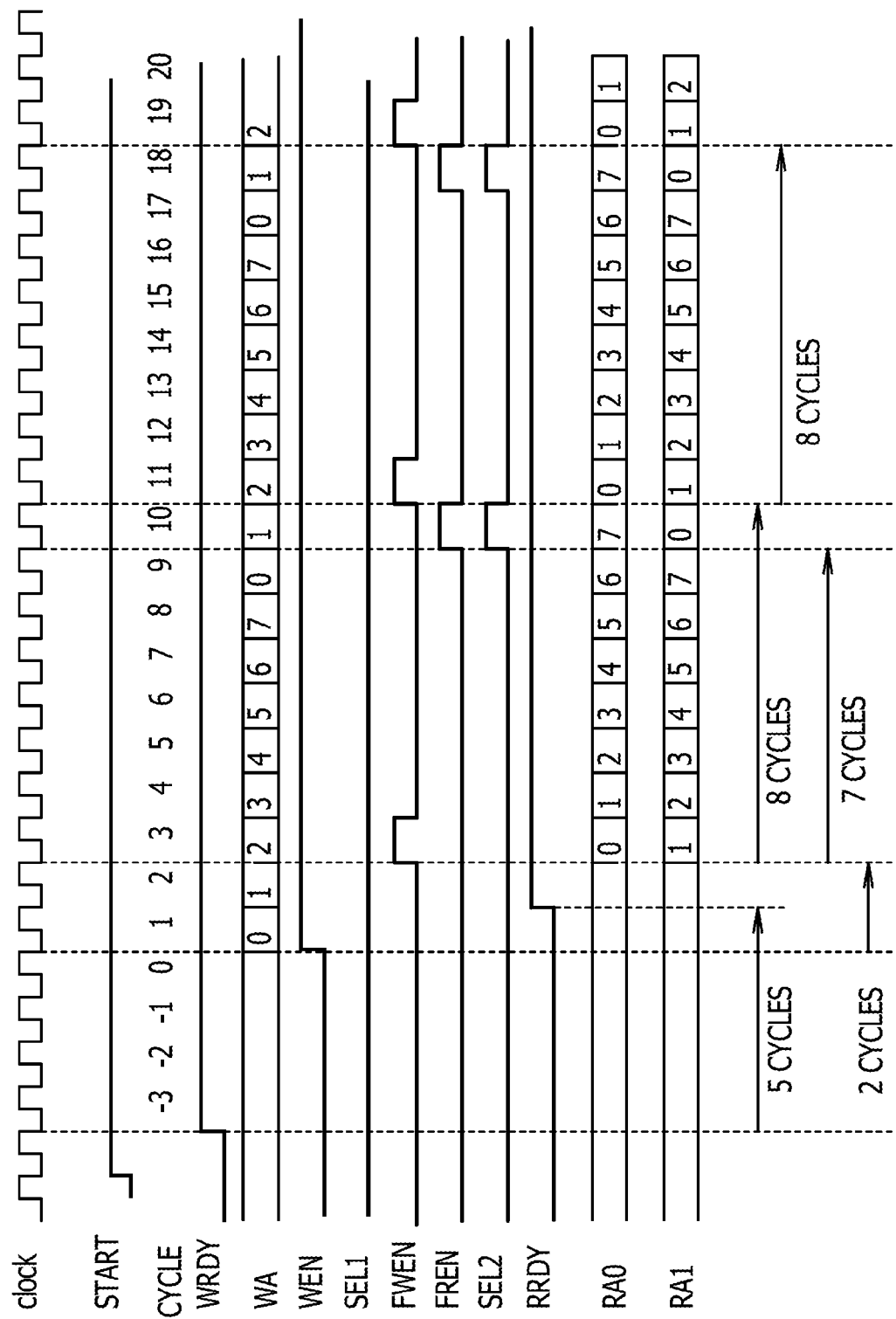
FIG. 14 is a timing chart illustrating an operation example of the interface circuit.

FIG. 14 is a timing chart illustrating an operation example of the interface circuit according to the present embodiment. FIG. 14 illustrates an operation when the circuit module 1220 performs the processing of the task A illustrated in FIG. 4, the circuit module 1230 performs the processing of the task B illustrated in FIG. 4, and the operation start interval of the interface circuit 1210, the circuit modules 1220 and 1230 is eight cycles in the configuration illustrated in FIG. 12.

When a start signal START indicating start of processing is changed to "1", the control circuit 1211 sets the write ready signal WRDY to "1". Thereafter, the processing of the task A is performed in the circuit module 1220, the write enable signal WEN output from the circuit module 1220 is changed to "1" in cycle 1, and the output data of the circuit module 1220 is written to the 0-th memory element of the memory 1212 specified by the write address WA. Thereafter, pieces of output data of the circuit module 1220 are written to memory elements of the memory 1212 specified by the write addresses WA similarly.

A period from start of the processing of the task A (after write ready signal WRDY is changed to "1") to writing of data to the memory 1212 that allows start of the processing of the task B (five cycles in this example) has elapsed by cycle 2. In cycle 2, the control circuit 1211 sets the read ready signal RRDY to "1". In next cycle 3, the read enable signal REN output from the circuit module 1230 that has received the read ready signal RRDY of "1" is changed to "1", and data pieces are read from the 0-th memory element and the 1-st memory element of the memory 1212 specified by read addresses RA0 and RA1 and output to the circuit module 1230 via a multiplexer 1214. Thereafter, pieces of data are read from memory elements of the memory 1212 specified by the read addresses RA0 and RA1 and output to the circuit module 1230 via the multiplexer 1214 similarly.

In cycle 3, the control circuit 1211 sets the FIFO write enable signal FWEN to "1". Thus, the data read from the 0-th memory element of the memory 1212 is written to the FIFO buffer 1213 via the multiplexer 1215. Then, in cycle 10 in which the 0-th memory element of the memory 1212 is specified again as the read address RA1, the control circuit 1211 sets both the FIFO read enable signal FREN and the control signal SEL2 to "1". Thus, the data written to the FIFO buffer 1213 in cycle 3 is output to the circuit module 1230 via the multiplexer 1214 as data of the 0-th memory element of the memory 1212.

Since the operation start interval of the interface circuit 1210 and the circuit modules 1220 and 1230 is eight cycles, each signal is similarly controlled and processing is performed every eight cycles thereafter.

The control circuit 1211 sets the write ready signal WRDY to "0" when cycles corresponding to the operation start interval of the circuit module 1220 (task A) elapses after the write ready signal WRDY is changed to "1". In addition, the control circuit 1211 sets the write ready signal WRDY to "1" when cycles corresponding to (operation start interval of the interface circuit 1210-operation start interval of the circuit module 1220) elapses after the write ready signal WRDY is changed to "0". However, since the operation start interval of the interface circuit 1210 and the operation start interval of the circuit module 1220 are the same in this example, the write ready signal WRDY remains "1".

Further, the control circuit 1211 sets the read ready signal RRDY to "0" when the cycles corresponding to the operation start interval of the circuit module 1230 (task B) elapses after the read ready signal RRDY is changed to "1". In addition, the control circuit 1211 sets the read ready signal RRDY to "1" when cycles corresponding to (operation start interval of the interface circuit 1210-operation start interval of the circuit module 1230) elapses after the read ready signal RRDY is changed to "0". However, since the operation start interval of the interface circuit 1210 and the operation start interval of the circuit module 1230 are the same in this example, the read ready signal RRDY remains "1".

Figure 15:
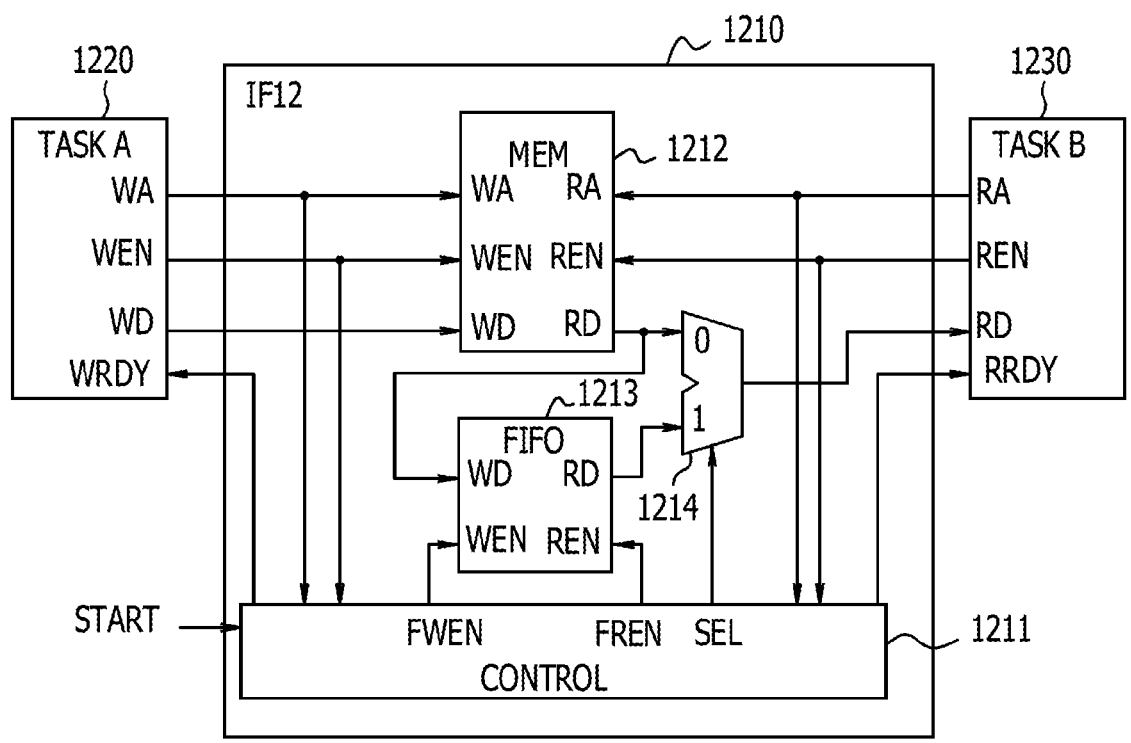
FIG. 15 is a diagram illustrating another exemplary configuration of the interface circuit.

FIG. 15 is a diagram illustrating another exemplary configuration of the interface circuit according to the present embodiment. In FIG. 15, components having the same functions as the components illustrated in FIG. 12 are denoted by the same reference signs. The interface circuit 1210 illustrated in FIG. 12 is configured such that either the first piece of read data RD output from the memory 1212 or the write data WD output from the circuit module 1220 is output to the FIFO buffer 1213 using the multiplexer 1215. However, the interface circuit 1210 may be configured without providing the multiplexer 1215 as illustrated in FIG. 15 in a case where the data stored in the FIFO buffer 1213 is data to be read a plurality of times in the processing of the task B.

In the embodiment described above, the larger minimum operation start interval among the minimum operation start interval of the circuit module that performs the processing of the task A and the minimum operation start interval of the circuit module that performs the processing of the task B is used as the operation start interval of each of the circuit module performing the processing of the task A, the circuit module performing the processing the task B, and the interface circuit. However, the operation start interval can be smaller by using a plurality of instances. For example, the operation start interval may be set to three cycles, which is the minimum operation start interval of the interface circuit.

Figures 16A, 16B:
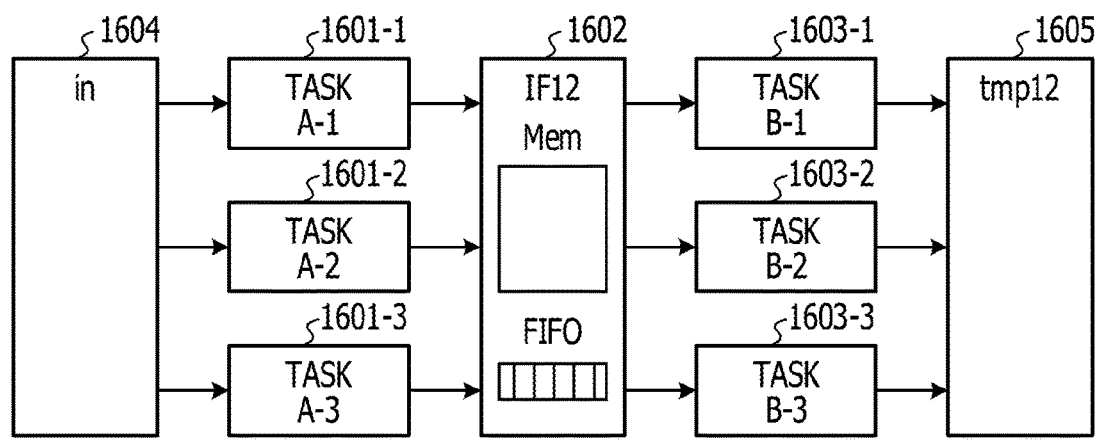
FIGS. 16A and 16B are diagrams for describing an example using a plurality of instances.

As illustrated in FIG. 16A, when the operation start interval in the interface circuit is three cycles, writing of data to the memory in the interface circuit by the processing of the task A is performed three times at most in parallel. The same applies to the access to the interface circuit by the processing of the task B. Therefore, by providing three circuit modules 1601 each performing the processing of the task A and three circuit modules 1603 each performing the processing of the task B as illustrated in FIG. 16B, the processing can be performed at an operation start interval of three cycles.

In FIG. 16B, reference signs 1601-1, 1601-2, and 1601-3 denote circuit modules, each of which performs the processing of the task A, a reference sign 1602 denotes an interface circuit, and reference signs 1603-1, 1603-2, and 1603-3 denote circuit modules, each of which performs the processing of the task B. Each of the circuit modules 1601-1, 1601-2, and 1601-3 performing the processing of the task A reads the input data in from a memory 1604 and performs the processing.

The circuit modules 1601-1, 1601-2, and 1601-3 supply output data obtained as the processing result to the circuit modules 1603-1, 1603-2, and 1603-3 each performing the processing of the task B via the interface circuit 1602. The circuit modules 1603-1, 1603-2, and 1603-3 perform processing using output data output from the circuit modules 1601-1, 1601-2, and 1601-3 respectively, and output the processing result to a memory 1605.

With this configuration, it is possible to reduce the time required for transferring data from the circuit modules that perform the processing of the task A to the circuit modules that perform the processing of the task B. Also, since the number of instances of the interface circuit responsible for data transfer is one, the circuit area can be small.

Assuming that the operation start interval of the circuit module that performs the processing of the task A, the circuit module that performs the processing of the task B, and the interface circuit is eight cycles, the access timings in the interface circuit are as illustrated in FIG. 11 described above. Furthermore, one memory element may be used commonly as memory elements having lifetimes that do not overlap each other by converting memory addresses. An example of access timings in the interface circuit when a memory element is commonly used is illustrated in FIG. 17. In the example illustrated in FIG. 17, the 0-th memory element, the 1-st memory element, and the 2-th memory element are commonly used, whereby the memory capacity in the interface circuit can be reduced from eight to five.

In the above description, a case where circuits that perform the processing described in the input descriptions illustrated in FIG. 4 are synthesized has been described as an example, but a more general case will be described below.

The values of a function schedule (task, resource, t) are listed in a matrix M having circuit resources in the row direction and time (cycle) in the column direction, and an element in row i and column j of the matrix M is represented by M[i, j]. The function schedule (task, resource, t) is a function that returns 1 when the circuit resource is used in the task at time t, and returns 0 when the circuit resource is not used. For example, the schedule information of the task A described above can be represented by a matrix having 19 rows and 11 columns as illustrated in FIG. 18. In FIG. 18, only values 1 are listed, and values 0 are not listed.

The operation start interval of a task is an index value indicating at how much time interval, the task is operated in a case where the processing is repeated at the task level. In a case where the task having schedule information represented by the matrix M starts at time 0 and then starts at time t, a circuit resource used at each time can be obtained by calculating M+shiftright (M, t). The function shiftright (M, t) is a function that returns a matrix obtained by shifting the elements of the matrix M to the right by t columns, and indicates the operating status of the circuit resource when the task having schedule information represented by the matrix M starts at time t. In addition, the values of matrix elements that are empty due to shift by the function shiftright are set to 0. Thus, when the matrix M has i rows and j columns, the function is expressed as follows.

$$shiftright(M, t)[i, j] = \begin{cases} M[i, j-t] & (0 \leq j-t) \\ 0 & (j-t < 0) \end{cases} \quad \text{[Expression 5]}$$

When the matrix M and the matrix obtained by shifting the matrix elements to the right are added, matrices with different numbers of columns are added. In such addition, a matrix element having no corresponding matrix element is added with an element value 0.

Figure 19C:
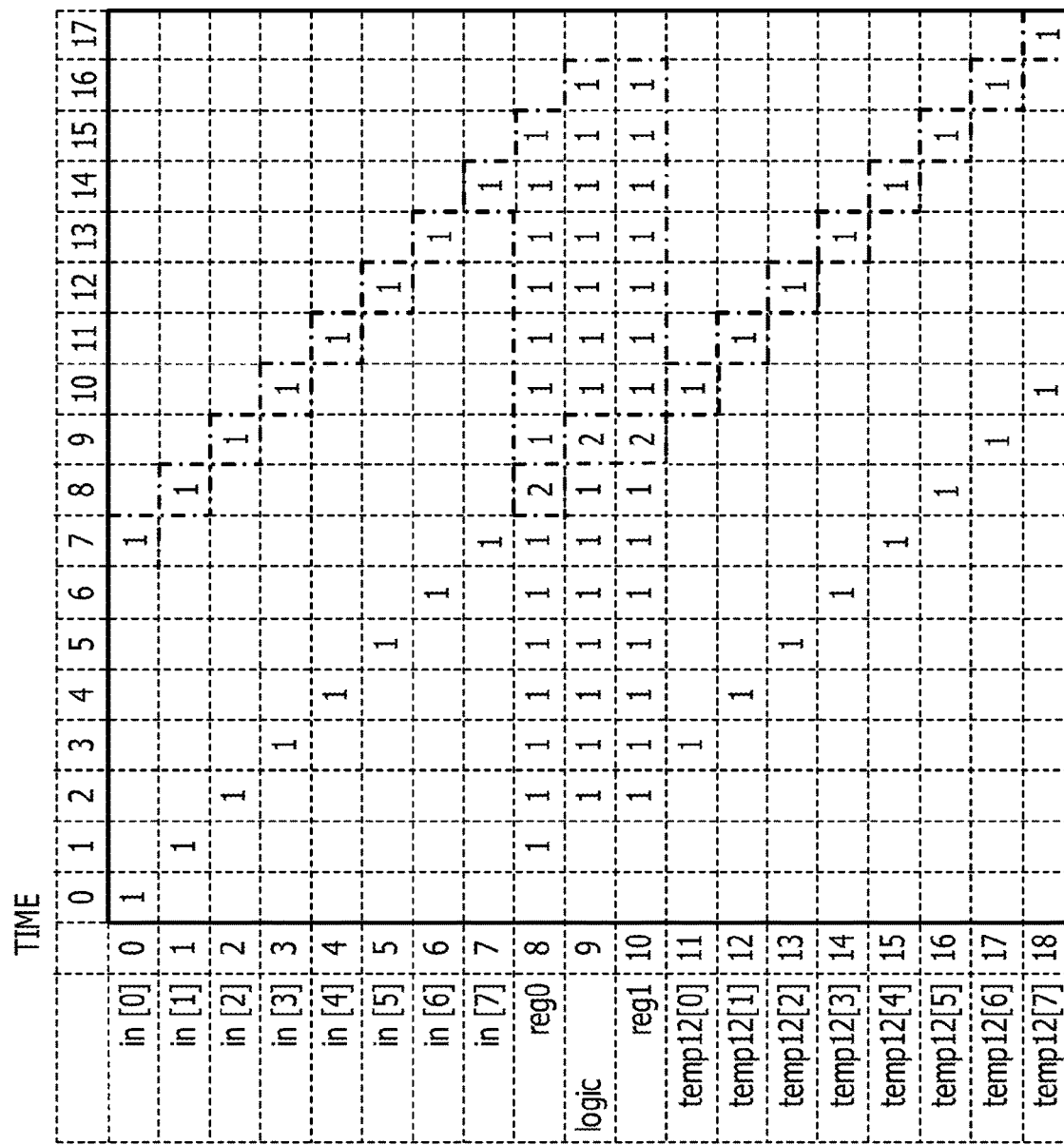

For example, M+shiftright (M, 11) representing a case where the operation start interval is set to 11 for the above-described task A is as illustrated in FIG. 19A. In addition, M+shiftright (M, 8) representing a case where the operation start interval is set to 8 is as illustrated in FIG. 19B, and M+shiftright (M, 7) representing a case where the operation start interval is 7 is illustrated in FIG. 19C. In FIG. 19C, there is a part where the value of elements is 2, and the value of 2 or more means that the allocation of the circuit resource is inconsistent and the scheduling is impossible. Thus, for the task A described above, the value of some matrix elements of M+shiftright (M, t) is 2 or more when the value of t is 7 or less. Therefore, the minimum value of the operation start interval of the task A is eight.

The write trace data of the first task on the data output side is represented by write $(x)=w_x$ ($x=0, 1, 2, \ldots, n-1$, where $w_x$ are real numbers that represent time). write $(x)=w_x$ indicates that data is written to the x-th memory element (memory address x) at time $w_x$. The read trace data of the second task on the data input side that receives the output data of the first task is represented by read $(x)=\{r_x^0, r_x^1, \ldots, r_x^{k-1}\}$ ($x=0, 1, 2, \ldots, n-1$, and $r_x^j$ are real numbers that represent time). read $(x)=\{r_x^0, r_x^1, \ldots, r_x^{k-1}\}$ indicates that data is read from the x-th memory element (memory address x) at times $r_x^0, r_x^1, \ldots, r_x^{k-1}$. The number of reading times may vary for each memory element (memory address). It is assumed that elements of the right sides $\{r_x^0, r_x^1, r_x^{k-1}\}$ of read (x) are sorted in ascending order without loss of generality. Thus, $r_x^j < r_x^{j+1}$ ($0 \leq j \leq k-2$). The minimum value $r_x^0$ is represented by $r_x^{min}$, and the maximum value $r_x^{k-1}$ is represented by $r_x^{max}$.

When the operation start time of the first task is represented by $t_1$ and the operation start time of the second task is represented by $t_2$, the data of all memory elements (memory addresses) have to satisfy a dependency that the reading is performed by the second task after writing is performed by the first task. This is a condition for correct data transfer from the first task to the second task. With interpretation of each of write trace data and read trace data as time, the minimum value of t is calculated based on the following simultaneous inequalities that satisfy $t_1$+write $(x)<t_2$+read (x) ($x=0, 1, 2, \ldots, n-1$).

$$t_1 + w_x < t_2 + r_x^0 \quad \text{[Expression 6]}$$
$$t_1 + w_x < t_2 + r_x^1$$
$$\ldots$$
$$t_1 + w_x < t_2 + r_x^{k-1}$$
$$x = 0, 1, 2, \ldots, n-1$$

This can be simplified as follows.

$$t_1+w_x<t_2+r_x^{min} \quad \text{[Expression 7]}$$

$$x=0,1,2,\ldots,n-1$$

Here, by using a variable t that satisfies $t_2-t_1=t$, the expression can be converted as follows.

$$(t_2-t)+w_x<t_2+r_x^{min}$$

$$w_x<t+r_x^{min} \quad \text{[Expression 8]}$$

$$x=0,1,2,\ldots,n-1$$

The minimum value of t among the solutions is represented by $t_{write}$. For example, the value $t_{write}$ is 5 for the task A and the task B described above, and $t_1=-3$, and $t_2=2$ because it is assumed that data is written to the 0-th memory element (memory address 0) at time 0 for convenience. The lifetime (x) that is the lifetime of the x-th memory element is expressed as lifetime $(x)=[t_1+w_x, t_2+r_x^{max}]$. $r_x^{max}$ is the maximum value of read (x), and thus, is max $(\{r_x^0, r_x^1, r_x^{k-1}\})$. lifetime $(x)=[t_1+w_x, t_2+r_x^{max}]$ indicates that data of the x-th memory element (memory address x) needs to be held from time $t_1+w_x$ to time $t_2+r_x^{max}$.

Here, for the interface circuit between the circuit module performing the processing of the first task and the circuit module performing the processing of the second task, trace data trace (if12, x) indicating when data is written to/read from the x-th memory element (memory address x) is expressed as (if12, x)=$[t_1+w_x, \{t_2 r_x^0, t_2 r_x^1, \ldots, t_2 r_x^{k-1}\}]$. Thus, the trace data includes write trace data of the first task that starts operation at time $t_1$ and read trace data of the second task that starts operation at time $t_2$.

The operation start interval when the processing of the interface circuit is repeatedly performed is calculated assuming that the processing starts for the first time at time 0 and the processing starts for the second time at time t. At this time, in order for data to be normally transferred from the first task to the second task, order relationship that lifetimes of memory elements in the second processing start after lifetimes of the memory elements in the first processing end has to be satisfied. Thus, since lifetime $(x)=[t_1+w_x, t_2+r_x^{max}]$ the minimum value of t that satisfies the following simultaneous inequalities is the minimum value of the operation start interval of the interface circuit.

$$t_2+r_x^{max}<t+t_1+w_x \quad \text{[Expression 9]}$$

$$x=0,1,2,\ldots,n-1$$

When an array variable corresponding to the data to be transferred from the first task to the second task is represented by tmp12, the schedule information of the interface circuit can be represented by the function schedule (if, tmp12[x], t) (x=0, 1, 2, . . . , n−1). The size of the tmp12 is n. The function schedule (if, tmp12[x], t) returns 1 when data is written to the circuit resource tmp12[x] at time t, returns 4 when data is read from the circuit resource tmp12[x] at time t, returns 16 when data is held in the circuit resource tmp12[x] at time t, and returns 0 otherwise as illustrated in FIG. 20A, for example. Thus, the function schedule (if, tmp12[x], t) returns 0 outside the period of the lifetime of the memory element.

When schedule information of the interface circuit between the circuit module that performs the processing of the first task and the circuit module that performs the processing of the second task is expressed in a matrix having circuit resources in the row direction and time (cycle) in the column direction, the matrix is represented by M (if12). The number of columns of the matrix M (if12) is represented by c (M (if12)). For example, the schedule information of the interface circuit between the task A and the task B described above is as illustrated in FIG. 20B.

The operation start interval when the processing of the interface circuit is repeatedly performed is calculated based on M (if12)+shiftright (M (if12), t). If all values of the matrix elements as a result of calculating M (if12)+shiftright (M (if12), t) are any one of 0, 1, 4, and 16, the schedule is possible, but if any value other than the values (for example, 2, 5, 8, 17, and 20) is included, the schedule is impossible.

First, time t is defined as t=c (M (if12)). Next, it is determined whether a schedule of M (if12)+shiftright (M (if12), t) is possible. If the schedule of M (if12)+shiftright (M (if12), t) is possible as a result, the time t is updated to t=t−1, and it is determined whether schedule M (if12)+shiftright (M (if12), t) is possible. The determination is repeated with decrement of the value of t by 1 until it is determined that the schedule of M (if12)+shiftright (M (if12), t) is impossible. When it is determined that the schedule of M (if12)+shiftright (M (if12), t) is impossible, the memory element (memory address) of the row where any value of the matrix elements becomes 2, 5, 8, 17, or 20 is determined as a memory element to be separated.

For example, in the interface circuit between the task A and the task B described above, the state of M (if12)+shiftright (M (if12), 10) is illustrated in FIG. 21A, and the state of M (if12)+shiftright (M (if12), 9) is illustrated in FIG. 21B. Those states are made without providing a separated memory device. Thus, as illustrated in FIG. 21B, a memory element to be separated is tmp12[0]. In the following description, it is assumed that the 0-th memory element is a memory element to be separated.

A method of improving the operation start interval of the interface circuit by providing a separated memory device will be described. A row vector for the 0-th memory element of the matrix M (if12) indicating the schedule information of the interface circuit is represented by M (if12) [x0]. A separated memory device for storing data of the 0-th memory element is newly introduced.

The time when writing to the 0-th memory element is performed is represented by wt0, the time when reading from the memory element is performed for the last is represented by rt0, and the time when reading from the memory element is performed for the second to the last is represented by rt1. The operation of the interface circuit is then changed as follows. The data read from the 0-th memory element at time rt1 is written to the separated memory device x0, and then it is considered that the lifetime of the 0-th memory element ends. Thus, lifetime (x0)=[wt0, rt1]. In addition, at time rt0, data is read from the separated memory device x0 and passed to the second task. The schedule information of the memory in the interface circuit that operates in this way is represented by M2 (if12), and the schedule information of the separated memory device is represented by M2 (FIFO (x0)). FIG. 22A illustrates the schedule information of the original M (if12) [x0], and M (if12) [x0] and M2 (FIFO (x0)) after the improvement.

In a case where the data of the 0-th memory element is read only once by the second task, the operation of the interface circuit is changed as follows. At time wt0, no data is written to the 0-th memory element, and data is written to the separated memory device x0. Then, at time rt0, data is read from the separated memory device x0 and output to the second task. The schedule information of the memory in the interface circuit that operates in this way is represented by M2 (if12), and the schedule information of the separated memory device is represented by M2 (FIFO (x0)). FIG. 22B illustrates the schedule information of the original M (if12) [x0], and M (if12) [x0] and M2 (FIFO (x0)) after the improvement.

Next, a method of determining the size of the memory device provided separately from the memory in the interface circuit will be described. As described below, row vectors are added with L set to an integer of 1 or more, and the maximum value among the matrix elements is obtained. Then, the obtained maximum value is divided by 16 and rounded up to the place of integer to obtain the size of the separated memory device.

$$\Sigma_{i=0}^{n-1} \text{shiftright}(M2(\text{FIFO}(x0)), L \times i) \quad \text{[Expression 10]}$$

In the example of the task A and the task B described above, assuming that the operation start interval of the interface circuit is 3, the sum row illustrated in FIG. 23 is the result of the addition of the values of the elements of the row vectors. Therefore, since the value obtained by dividing 36 by 16 and rounding up to the place of integer is 3, the size of separated memory device is 3.

Figure 24:
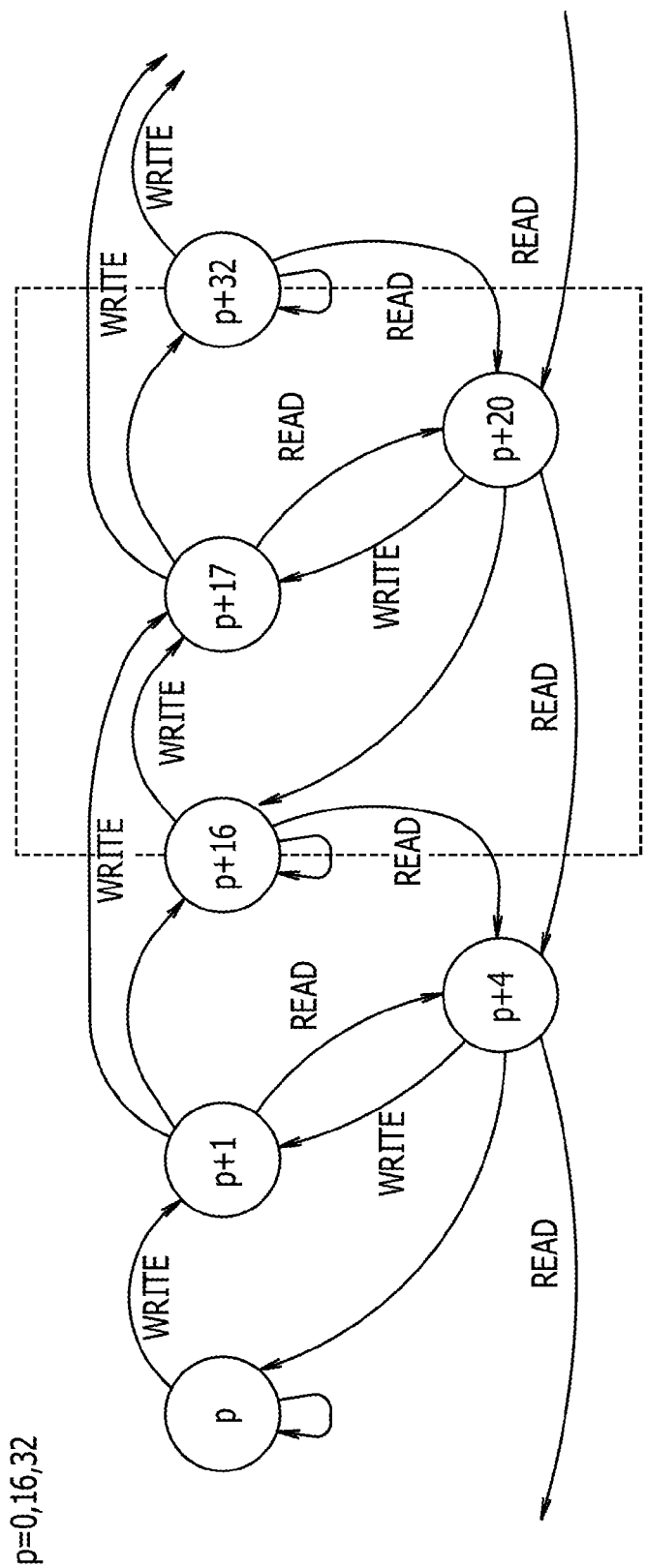
FIG. 24 is a diagram illustrating an operation model of a separately provided memory device.

FIG. 24 illustrates a state transition diagram of a control circuit that controls the separated memory device provided in the interface circuit. FIG. 24 illustrates a state when p=0. However, p=0 and p=16 correspond to each other, and a state is transited to states p=a+16, a+17, a+20, and a+32 (a=0, 16, 32, ...) repeatedly. For example, if data is held in the state of p=a+16, the state is maintained, and if data is written, the state is transited to a state of the value obtained by adding 1. If data is read in the state of p=a+17, the state is transited to a state of the value obtained by adding 3.

According to the present embodiment, when the minimum operation start interval of the interface circuit is larger than the minimum operation start interval of the circuit module, it is possible to improve processing performance while suppressing increase in circuit area by providing a memory device (storage element) separated from the memory provided in the interface circuit to reduce the operation start interval of the interface circuit. In addition, since write trace data and read trace data are obtained from schedule information, and interface circuits are automatically synthesized based on the write trace data and the read trace data, design steps may be reduced and an interface circuit having an appropriate circuit area may be designed.

Figure 25:
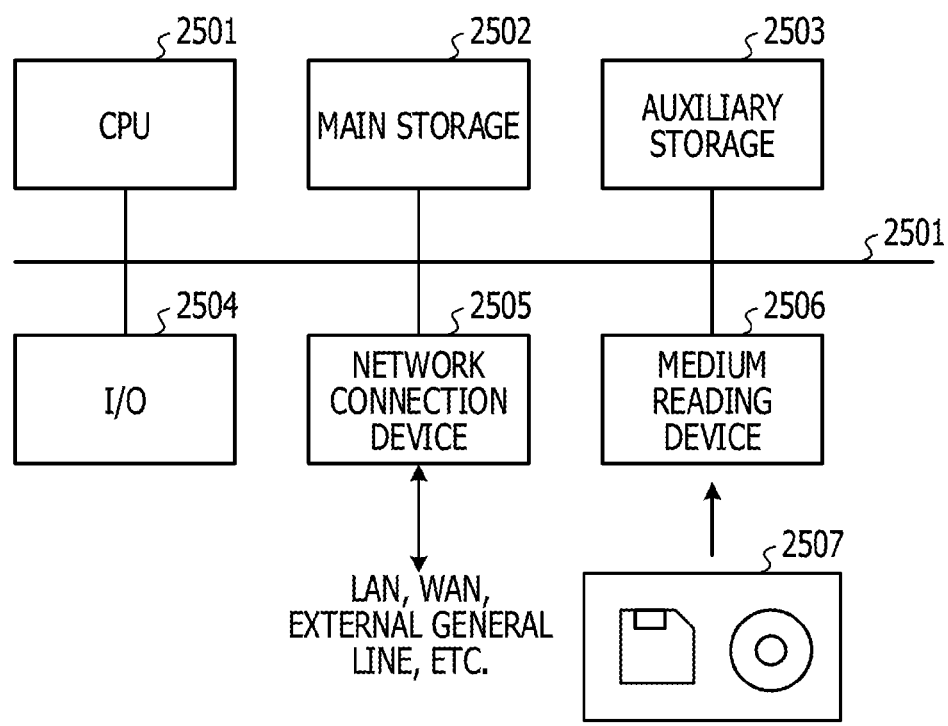
FIG. 25 is a functional block diagram of a computer that can realize the information processing device according to the embodiment.

FIG. 25 is a functional block diagram of a computer that can realize the information processing device according to the present embodiment. As illustrated in FIG. 25, the computer has a Central Processing Unit (CPU) 2501, a main storage 2502 as a work area for each program, an auxiliary storage 2503 such as a hard disk on which each program and database are stored, an input/output device (I/O) 2504 such as a display and a keyboard, a network connection device 2505 for connection to a network, and a medium reading device 2506 that reads stored content from a portable storage medium such as a disk, or a magnetic tape, and the components are communicably connected to each other via a bus 2508.

When software realizes functions related to configuration synthesis or logic synthesis, and functions related to automatic synthesis (including schedule information extraction) of the interface circuit between modules, the CPU 2501 realizes the functions based on a program by reading data from the main storage 2502 or the auxiliary storage 2503 and using the main storage 2502 as a work area. In the computer illustrated in FIG. 25, the medium reading device 2506 reads programs and data stored in a storage medium 2507 such as a disk or a magnetic tape, and downloads the program and data to the main storage 2502 or the auxiliary storage 2503. Each part of the processing according to the present embodiment can be realized using software by the CPU 2501 executing this program.

In the computer illustrated in FIG. 25, application software may be exchanged using a storage medium 2507 such as a disk or a magnetic tape. Thus, the present embodiment can also be configured as a program for causing a computer to perform the functions according to the present embodiment described above when used by the computer or a computer readable storage medium 2507. As the recording medium, for example, a flexible disk, a hard disk, an optical disk, a magneto-optical disk, a CD-ROM, a magnetic tape, a non-volatile memory card, a ROM or the like can be used.

In addition, the embodiment described above provides only one example of implementation in implementing this invention, and it is not desirable that the technical scope of the present invention is interpreted as limited to the embodiment. That is, the present invention can be implemented in various forms without departing from the technical idea or the main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:

a memory;

a processor coupled to the memory and configured to:

perform, based on input descriptions of a first circuit module that performs processing of a first task and a second circuit module that receive data output from the first circuit module and performs processing of a second task, high-level synthesis of the first circuit module and the second circuit module;

synthesize an interface circuit that includes a memory to and from which the data is input and output and that performs data transfer between the first circuit module and the second circuit module based on write information of the data that is written to the interface circuit by the first circuit module and read information of the data which is read from the interface circuit by the second circuit module;

calculate a minimum operation start interval of the interface circuit based on the write information of the data and the read information of the data; and provide, when the calculated minimum operation start interval is larger than a minimum operation start interval of each of the first circuit module and the second circuit module, a storage element that is different from the memory and that stores data which is input to or output from the memory in the interface circuit based on the minimum operation start intervals of the first circuit module and the second circuit module.

2. The information processing device according to claim 1, wherein
the processor is configured to:
output first schedule information indicating a flow of processing in the first circuit module and second schedule information indicating a flow of processing in the second circuit module;
extract the write information of the data from the first schedule information; and
extract the read information of the data from the second schedule information.

3. The information processing device according to claim 2, wherein the minimum operation start interval of the first circuit module is calculated based on the first schedule information, and the minimum operation start interval of the second circuit module is calculated based on the second schedule information.

4. The information processing device according to claim 1, wherein the storage element is a FIFO buffer.

5. The information processing device according to claim 4, wherein the processor is configured to:
analyze a period for which the memory holds the data based on the write information of the data and the read information of the data; and
determine a size of the FIFO buffer based on an analysis result.

6. The information processing device according to claim 1, wherein the storage element is a register.

7. The information processing device according to claim 1, wherein a plurality of memory elements are provided as the memory element, and one or more memory elements that are included in specified memory elements specified by the write information and the read information of the data from among the plurality of memory elements and in which periods to hold the data do not overlap each other are shared.

8. The information processing device according to claim 1, wherein the processor is configured to logically synthesize circuit information of the first circuit module and the second circuit module and circuit information of the interface circuit.

9. An information processing method comprising:
performing, by an information processing device, based on input descriptions of a first circuit module that performs processing of a first task and a second circuit module that receive data output from the first circuit module and performs processing of a second task, high-level synthesis of the first circuit module and the second circuit module;
synthesizing, an interface circuit that includes a memory to and from which the data is input and output and that performs data transfer between the first circuit module and the second circuit module based on write information of the data that is written to the interface circuit by the first circuit module and read information of the data that is read from the interface circuit by the second circuit module;
calculating a minimum operation start interval of the interface circuit is calculated based on the write information of the data and the read information of the data; and
providing, when the calculated minimum operation start interval is larger than a minimum operation start interval of each of the first circuit module and the second circuit module, a storage element that is different from the memory and that stores data which is input to or output from the memory in the interface circuit based on the minimum operation start intervals of the first circuit module and the second circuit module.

10. The information processing method according to claim 9, further comprising:
outputting first schedule information indicating a flow of processing in the first circuit module and second schedule information indicating a flow of processing in the second circuit module;
extracting the write information of the data from the first schedule information; and
extracting the read information of the data from the second schedule information.

11. The information processing method according to claim 9, wherein the storage element is a FIFO buffer.

12. The information processing method according to claim 9, wherein the storage element is a register.

13. The information processing method according to claim 9, wherein a plurality of memory elements are provided as the memory element, and one or more memory elements that are included in specified memory elements specified by the write information and the read information of the data from among the plurality of memory elements and in which periods to hold the data do not overlap each other are shared.

14. The information processing method according to claim 9, further comprising logically synthesizing circuit information of the first circuit module and the second circuit module and circuit information of the interface circuit.

15. A non-transitory computer-readable recording medium having stored therein a program for causing a computer to execute a process comprising:
performing, based on input descriptions of a first circuit module that performs processing of a first task and a second circuit module that receive data output from the first circuit module and performs processing of a second task, high-level synthesis of the first circuit module and the second circuit module; and
synthesizing an interface circuit that includes a memory to and from which the data is input and output and that performs data transfer between the first circuit module and the second circuit module based on write information of the data that is written to the interface circuit by the first circuit module and read information of the data that is read from the interface circuit by the second circuit module;
calculating a minimum operation start interval of the interface circuit based on the write information of the data and the read information of the data; and
providing, when the calculated minimum operation start interval is larger than a minimum operation start interval of each of the first circuit module and the second circuit module, a storage element that is different from the memory and that stores data which is input to or/output from the memory in the interface circuit based on the minimum operation start intervals of the first circuit module and the second circuit module.

* * * * *